US012648157B2

(12) United States Patent
Wang et al.

(10) Patent No.: US 12,648,157 B2
(45) Date of Patent: Jun. 2, 2026

(54) HYBRID HIGH BANDWIDTH MEMORIES

(71) Applicant: INTERNATIONAL BUSINESS MACHINES CORPORATION, Armonk, NY (US)

(72) Inventors: Wei Wang, Yorktown Heights, NY (US); Ruilong Xie, Niskayuna, NY (US); Alexander Reznicek, Troy, NY (US); Heng Wu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/410,499

(22) Filed: Aug. 24, 2021

(65) Prior Publication Data

US 2023/0068802 A1 Mar. 2, 2023

(51) Int. Cl.
| | |
|---|---|
| *H10B 99/00* | (2023.01) |
| *H01L 25/065* | (2023.01) |
| *H10B 10/00* | (2023.01) |
| *H10B 12/00* | (2023.01) |

(52) U.S. Cl.
CPC ......... *H10B 99/00* (2023.02); *H01L 25/0652* (2013.01); *H10B 10/12* (2023.02); *H10B 12/30* (2023.02)

(58) Field of Classification Search
CPC .................... H10B 51/20; H10B 53/20; H10B 12/00–038; H01L 25/18; H01L 25/065; H01L 25/0657; H01L 27/10805; H01L 27/10808; H01L 27/10814; H01L 27/10817
See application file for complete search history.

(56) References Cited

U.S. PATENT DOCUMENTS

| | | |
|---|---|---|
| 6,222,216 B1 | 4/2001 | Rao et al. |
| 6,448,134 B2 | 9/2002 | Kim |
| 6,822,280 B2 | 11/2004 | Ito et al. |
| 9,841,920 B2 | 12/2017 | Vogt |
| 10,180,906 B2 | 1/2019 | Stocksdale et al. |

(Continued)

FOREIGN PATENT DOCUMENTS

| | | |
|---|---|---|
| CN | 108762671 A | 11/2018 |
| JP | 2001-196565 A | 7/2001 |

(Continued)

OTHER PUBLICATIONS

Peng IB, Gioiosa R, Kestor G, Cicotti P, Laure E, Markidis S. Exploring the performance benefit of hybrid memory system on HPC environments. In2017 IEEE International Parallel and Distributed Processing Symposium Workshops (IPDPSW) May 27, 2017 (pp. 683-692). IEEE.

(Continued)

*Primary Examiner* — Jesse Y Miyoshi
(74) *Attorney, Agent, or Firm* — Tutunjian & Bitetto, P.C.; Samuel Waldbaum

(57) ABSTRACT

A high bandwidth memory is provided. The high bandwidth memory includes a region of dynamic random access memory devices, a region of non-volatile memory devices adjacent to the region of dynamic random access memory devices, and a region of logic devices adjacent to both the region of dynamic random access memory devices and the region of non-volatile memory devices.

14 Claims, 20 Drawing Sheets

(56)         References Cited

U.S. PATENT DOCUMENTS

| | | | |
|---|---|---|---|
| 10,180,928 | B2 | 1/2019 | Nurvitadhi et al. |
| 10,446,229 | B2 | 10/2019 | Rangan et al. |
| 10,467,177 | B2 | 11/2019 | Shokrollahi et al. |
| 10,937,766 | B2 | 3/2021 | Liu |
| 2001/0003665 | A1* | 6/2001 | Kim ........................ H10B 12/09 257/E21.648 |
| 2003/0085420 | A1 | 5/2003 | Ito et al. |
| 2005/0040448 | A1* | 2/2005 | Park .................. H01L 21/31116 257/E21.252 |
| 2006/0138463 | A1* | 6/2006 | Kim ........................ H10B 10/18 257/296 |
| 2008/0079049 | A1* | 4/2008 | Lee ........................ H10B 53/30 438/243 |
| 2015/0263073 | A1* | 9/2015 | Lin .................... H10N 70/8828 257/5 |
| 2015/0340366 | A1* | 11/2015 | Lim ........................ G11C 16/10 257/401 |
| 2017/0160987 | A1 | 6/2017 | Royer, Jr. et al. |
| 2017/0220499 | A1 | 8/2017 | Gray |
| 2018/0210830 | A1 | 7/2018 | Malladi et al. |
| 2019/0179769 | A1 | 6/2019 | Keeth et al. |
| 2020/0194437 | A1 | 6/2020 | Song et al. |
| 2020/0250090 | A1 | 8/2020 | Ware et al. |
| 2020/0328181 | A1 | 10/2020 | Liu et al. |

FOREIGN PATENT DOCUMENTS

| | | | |
|---|---|---|---|
| JP | 2003-142605 | A | 5/2003 |
| JP | 2004-319573 | A | 11/2004 |
| JP | 2007-129040 | A | 5/2007 |
| JP | 2024-503399 | A | 1/2024 |
| WO | 2018063370 | A1 | 9/2016 |

OTHER PUBLICATIONS

International Search Report issued in corresponding PCT Application No. PCT/EP2022/069807 dated Nov. 3, 2022, 5 pgs.

Jia et al., "Dynamic Adaptive Replacement Policy in Shared Last-Level Cache of DRAM/PCM Hybrid Memory for Big Data Storage", IEEE Transactions on Industrial Informatics, vol. 13, No. 4, Aug. 2017, pp. 1951-1960.

Authors et al.: Disclosed Anonymously, "Two-tier main memory subsystem and its management", ip.com, IP.com No. IPCOM000224156D, Dec. 2012, pp. 1-5.

Japan Patent Office, "Notice of Reasons for Refusal" Nov. 18, 2025, 11 Pages, JP Application No. 2024-503399.

German Patent and Trademark Office, "Office Action," Jan. 14, 2026, 11 Pages, DE Application No. 112022003619.2.

Japan Patent Office, "Decision to Grant a Patent" Feb. 10, 2026, 03 Pages, JP Application No. 2024-503399.

* cited by examiner

HYBRID HIGH BANDWIDTH MEMORIES

BACKGROUND

The present invention generally relates to integration of non-volatile (NV) memory with dynamic random access memory (DRAM) on a memory die, and more particularly to dual state and multi state memories forming a hybrid high bandwidth memory in artificial intelligence (AI) systems.

High Bandwidth Memories (HBM) can have higher bandwidth by stacking dynamic random-access memory (DRAM) dies. The HBM may be connected to a memory controller on a central processing unit (CPU) or a graphics processing unit (GPU) through a substrate that can include an interposer that routes the electrical connections. The HBM can have a wider memory bus in comparison to other types of DRAM memories, for example, a HBM may have a 512 channel bus, a 1024 channel bus, a 2048 channel bus or a 4096 channel bus, with the bus connections made through an interposer. The 3D-stacked random-access memory (RAM) of the HBM can use through-silicon vias (TSV) to interconnect the memory dies and CPU/GPU.

Resistive random-access memory (ReRAM or RRAM) is a type of non-volatile (NV) random access computer memory that works by changing the resistance of the storage device. Phase-change memory (PCM) is a type of non-volatile random access computer memory that works by an amorphous/crystalline phase transition that have different electrical resistance values.

SUMMARY

In accordance with an embodiment of the present invention, a high bandwidth memory is provided. The high bandwidth memory includes a region of dynamic random access memory devices, a region of non-volatile memory devices adjacent to the region of dynamic random access memory devices, and a region of logic devices adjacent to both the region of dynamic random access memory devices and the region of non-volatile memory devices.

In accordance with another embodiment of the present invention, a high bandwidth memory is provided. The high bandwidth memory includes a region of dynamic random access memory devices, a region of non-volatile memory devices adjacent to the region of dynamic random access memory devices, a region of logic devices adjacent to both the region of dynamic random access memory devices and the region of non-volatile memory devices, and a protective spacer layer that electrically insulates the region of non-volatile memory devices from the region of dynamic random access memory devices and the logic region from the region of dynamic random access memory devices.

In accordance with yet another embodiment of the present invention, a method of forming a high bandwidth memory is provided. The method includes forming a region of dynamic random access memory devices on a die, forming a region of non-volatile memory devices adjacent to the region of dynamic random access memory devices on the die, forming a region of logic devices adjacent to both the region of dynamic random access memory devices and the region of non-volatile memory devices on the die, and forming a protective spacer layer that electrically insulates the region of non-volatile memory devices from the region of dynamic random access memory devices and the logic region from the region of dynamic random access memory devices.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a non-volatile, dual-state/multi-state memory component together with dynamic random-access memory on the same die. The combination of non-volatile, dual-state/multi-state memory component with the dynamic random-access memory can provide stacked High Bandwidth Memories (HBM). The combined non-volatile, dual-state/multi-state memory and dynamic random-access memory can provide improved compute performance and reduce power consumption. The improved compute performance and reduce power consumption can be provided by performing computations in near memory that results in less data fetching from remote DRAM.

Embodiments of the present invention can also provide dual-state and multi-state memories forming hybrid high bandwidth memory (HBM) for artificial intelligence (AI) systems. For neural networks (NN) and other AI calculations, data can be retrieved from HBM and the calculations done by a GPU/CPU. The performance of such a system may be limited by HBM-GPU bandwidth. Wider HBM internal bandwidth provides for less data transfer between off-chip memory (e.g., DRAM) and the computer (e.g., GPU/CPU) cores. By having processing units (PCM or ReRAM) integrated into each DRAM die, computing can be parallelized on all DRAM dies, which eliminates the limitation of HBM-GPU/CPU bandwidth restrictions and improves computer performance. Keeping data local in HBM could boost system energy efficiency because the energy cost of off-chip data fetching is higher than local data fetching.

In reduced-precision arithmetic used by AI/NN, memory limited operations can be improved by utilizing multiple-states memory for computations.

Embodiments of the present invention also provide a method of fabricating non-volatile, dual-state/multi-state memory component together with dynamic random-access memory on the same die. Peripheral logic (e.g., NAND, NOR, XOR, etc.) can also be included on the same die with the non-volatile, dual-state/multi-state memory and dynamic random-access memory.

Exemplary applications/uses to which the present invention can be applied include, but are not limited to: high bandwidth memory device, an artificial intelligence system, or a neural network.

It is to be understood that aspects of the present invention will be described in terms of a given illustrative architecture; however, other architectures, structures, substrate materials and process features and steps can be varied within the scope of aspects of the present invention.

Figure 1:
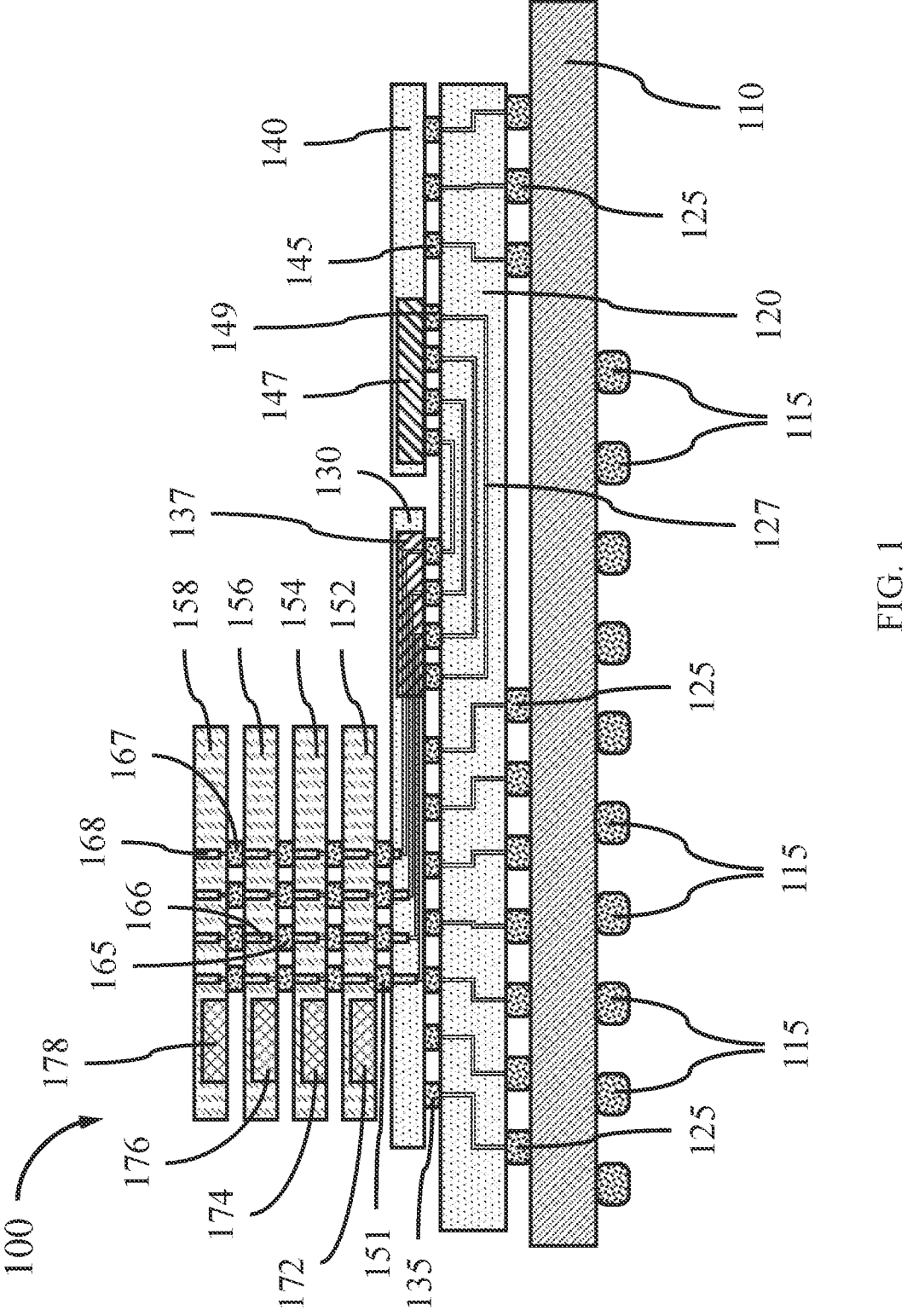
FIG. 1 is a cross-sectional side view showing a stacked high bandwidth memory device with integrated non-volatile dual/multi-state memory, in accordance with an embodiment of the present invention.

Referring now to the drawings in which like numerals represent the same or similar elements and initially to FIG. 1, a cross-sectional side view of a stacked high bandwidth memory device with integrated non-volatile dual/multi-state memory is shown, in accordance with an embodiment of the present invention.

In one or more embodiments, a stacked high bandwidth memory device 100 can be formed on a packaging substrate 110, where an interposer 120 can be attached to the packaging substrate 110 and electrically connected through interposer solder bumps 125. The packaging substrate 110 can have substrate solder bumps 115 for electrically connecting to the outside world. The packaging substrate can be a central processing unit (CPU) or a graphics processing unit (GPU) substrate, and the interposer 120 can route electronic signals between the attached dies.

In various embodiments, a logic die 130 (e.g., memory controller) can be attached to the interposer 120 and electrically connected through logic die solder bumps 135. In various embodiments, a processor die 140 (e.g., CPU/GPU/system-on-chip) can be attached to the interposer 120 and electrically connected to the packaging substrate 110 through processor die solder bumps 145. The logic die 130 can be a logic control unit which can provide logic control support, for example, address translation, etc. The processor die 140 can provide processor functions, for example, calculations, memory access, and executing software code.

In one or more embodiments, a stack of high bandwidth memory (HBM) dies 152, 154, 156, 158 can be placed on the logic die 130, where the high bandwidth memory (HBM) dies 152, 154, 156, 158 can be attached to and electrically interconnected with each adjacent HBM die by through silicon vias 166, 168 and micro solder bumps 165, 167. The HBM die 152 adjacent to the logic die 130 can be attached to and electrically connected with the logic die 130 by micro solder bumps 151.

In one or more embodiments, each high bandwidth memory (HBM) die 152, 154, 156, 158 can include a non-volatile, dual/multiple state memory device region 172, 174, 176, 178, that can be made up of a plurality of phase-change memory (PCM) and/or resistive random-access memory (ReRAM or RRAM) devices. The high bandwidth memory (HBM) die(s) 152, 154, 156, 158 can include a plurality of dynamic random access memory (DRAM) devices, where a region of the DRAM devices can be adjacent to a non-volatile, dual/multiple state memory device region 172, 174, 176, 178. The memory can be synchronous dynamic random access memory (SDRAM).

In various embodiments, the logic die 130 can be interconnected with the processor die 140 through physical layer (PHY) components 137, 147, where the PHY components can be electrically connected to the interposer 120 through physical layer (PHY) micro solder bumps 149 and interposer interconnects 127. The PHY components 137, 147 can act as a network interface controller with a communication medium (e.g., metal lines) to provide communication between the High Bandwidth Memory and a processor die 140. PHY can connect a link layer component (e.g., medium access control (MAC)) to a physical communication medium, and provide the means of transmitting bits over such interconnects.

Figure 2:
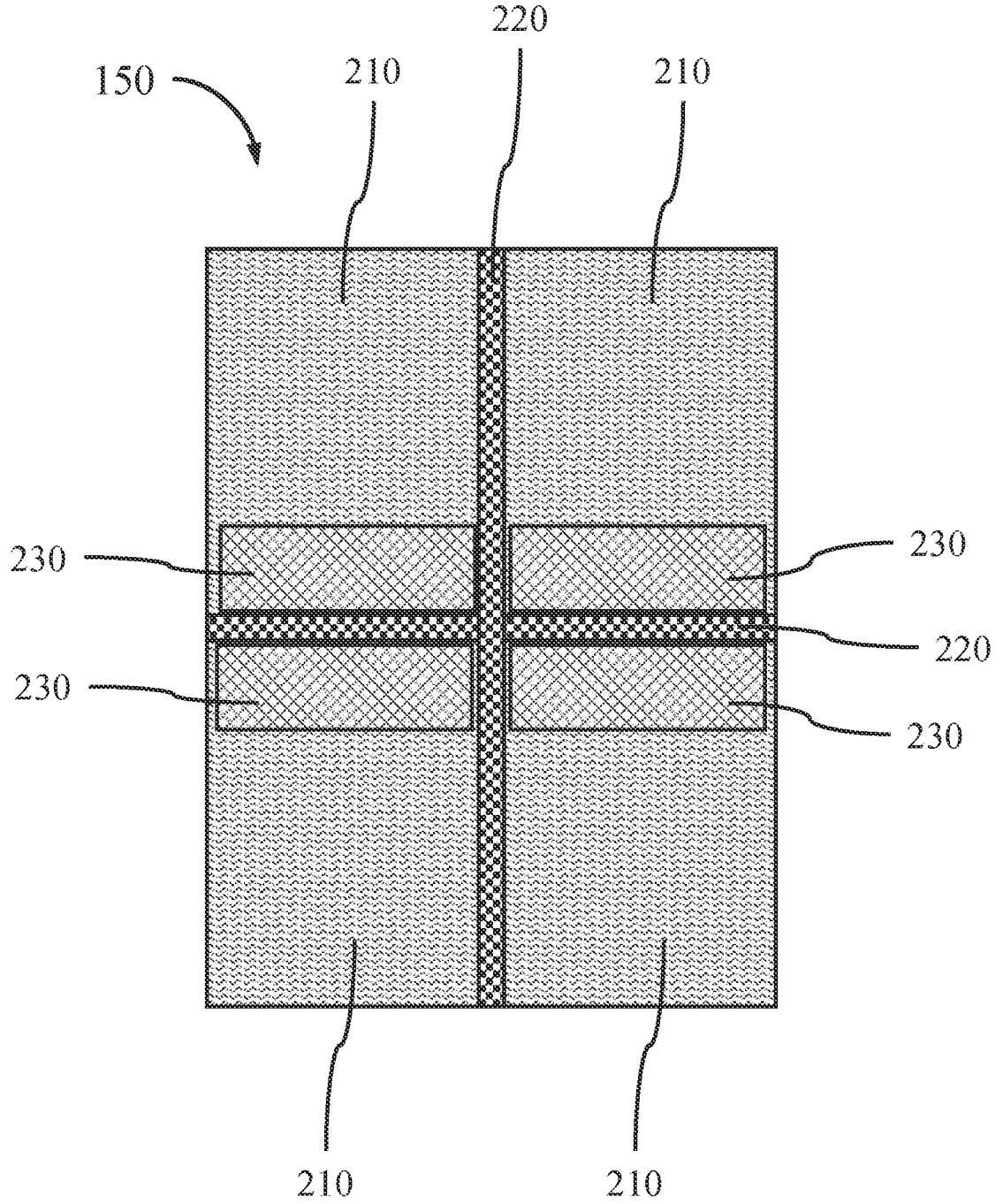
FIG. 2 is a top view showing a high bandwidth memory device with an arrangement of DRAM arrays integrated together with non-volatile dual/multiple-state memory arrays and periphery logic transistors, in accordance with an embodiment of the present invention.

FIG. 2 is a top view showing a high bandwidth memory device with an arrangement of DRAM arrays integrated together with non-volatile dual/multiple-state memory arrays and periphery logic transistors, in accordance with an embodiment of the present invention.

In one or more embodiments, one or more DRAM regions 210 including a plurality of dynamic random access memory (DRAM) devices can be on a HBM die 150, which can form a stack of HBM memory dies 152, 154, 156, 158. One or more non-volatile memory regions 230 can be on the HBM die 150 and adjoining a DRAM region 210. A logic region 220 can be adjoining one or more DRAM region 210 and one or more non-volatile memory regions 230 on the HBM die 150. The DRAM region(s) 210 can include DRAM memory arrays, including SDRAM, and the non-volatile memory regions 230 can include non-volatile dual/multi-state memory arrays. The logic region 220 can include peripheral logic transistors, which can enable the functioning of the memory. The peripheral logic can provide, for example, pre-charge circuitry and sense amplifiers, which can cause a bit-line to charge or discharge a cell storage capacitor. The DRAM region 210 can be arranged in quadrants separated by the logic region 220, and the non-volatile memory regions 230 can be located in each of the DRAM quadrants.

Figures 3, 4:
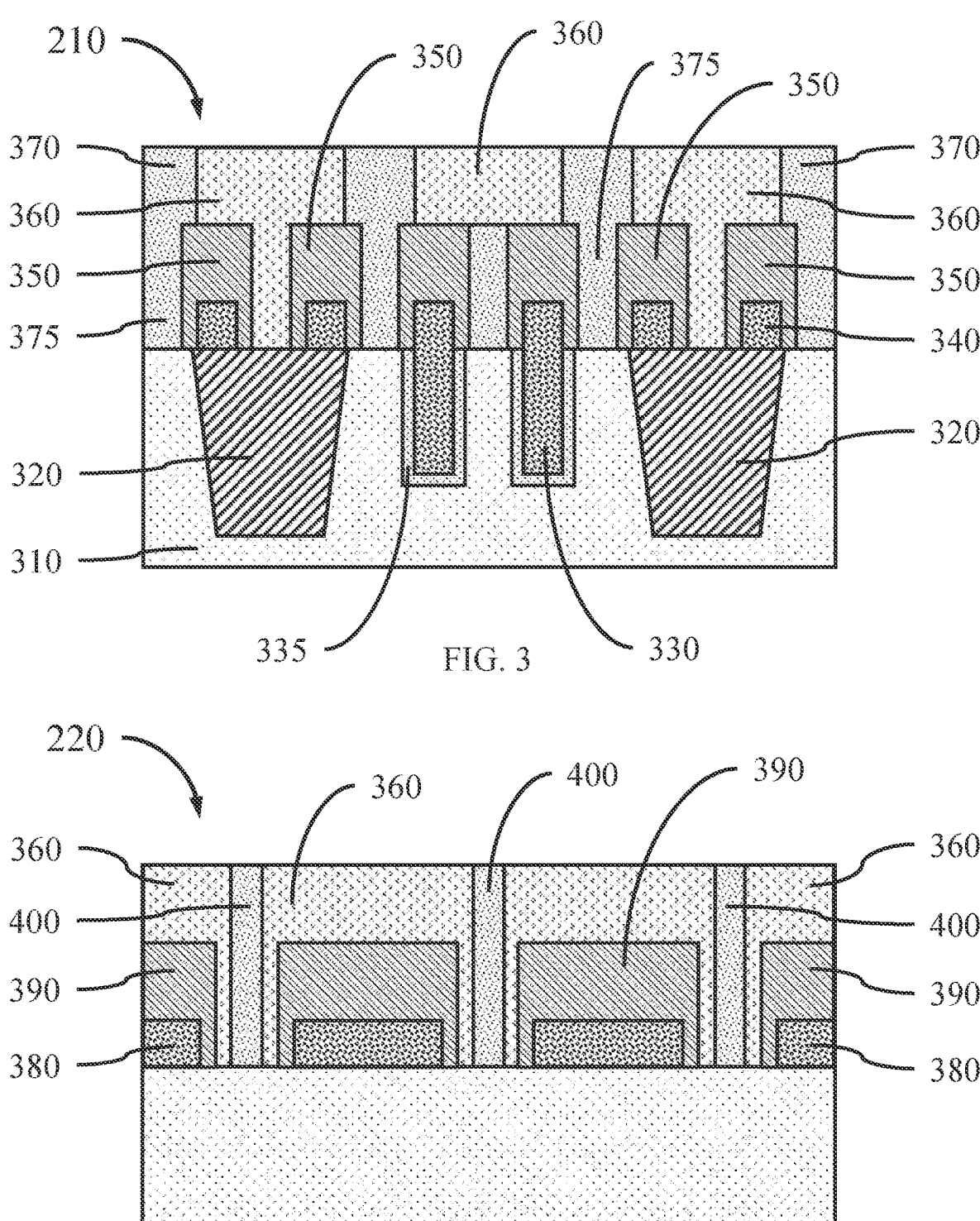
FIG. 3 is a cross-sectional side view showing a region of dynamic random access memory devices of a stacked high bandwidth memory device, in accordance with an embodiment of the present invention.
FIG. 4 is a cross-sectional side view showing a region of logic devices of the stacked high bandwidth memory device, in accordance with an embodiment of the present invention.

FIG. 3 is a cross-sectional side view showing a region of dynamic random access memory devices of a stacked high bandwidth memory device, in accordance with an embodiment of the present invention.

In one or more embodiments, the DRAM region(s) 210 can include a plurality of transistor devices, including gate structure(s) 330, 340 and gate spacers/gate caps 350 over the gate structure(s) 330, 340. In various embodiments, the transistor device(s) can be planar transistors, fin field effect transistors (FinFETs), nanosheet transistors, nanowire transistors, and combinations thereof. The transistor devices can be U-shaped channel transistor devices with a U-shaped channel 335 around an elongated gate structure 330 to provide greater channel length within a small device footprint. The gate structure(s) 330 of the U-shaped channel transistor devices can function as a word line for memory access operations. A bit line can be formed to the U-shaped channel transistor devices through a bit line contact. Isolation regions 320 can be formed in the substrate to electrically insulate the transistor devices and electrically separate different regions of the substrate 310. The substrate can be a semiconductor material that electronic devices can be fabricated on/in. A dielectric fill 360 can be formed on the substrate between adjacent transistor devices for electrical insulation, where the dielectric fill 360 can be silicon oxide (SiO), silicon nitride (SiN), low-k dielectric, or combination thereof. Storage Node Contact (SNC) 370 can be vias formed to source/drain contacts 375.

FIG. 4 is a cross-sectional side view showing a region of logic devices of the stacked high bandwidth memory device, in accordance with an embodiment of the present invention.

In one or more embodiments, the logic region 220 can include transistor devices, including a gate 380 over a channel, and a gate spacer/dielectric cap 390 on the gate 380, a dielectric fill 360 and a source/drain contact 400 to the substrate. In various embodiments, the transistor device(s) can be planar transistors, FinFET transistors, nanosheet transistors, nanowire transistors, and combinations thereof.

Figures 5, 6:
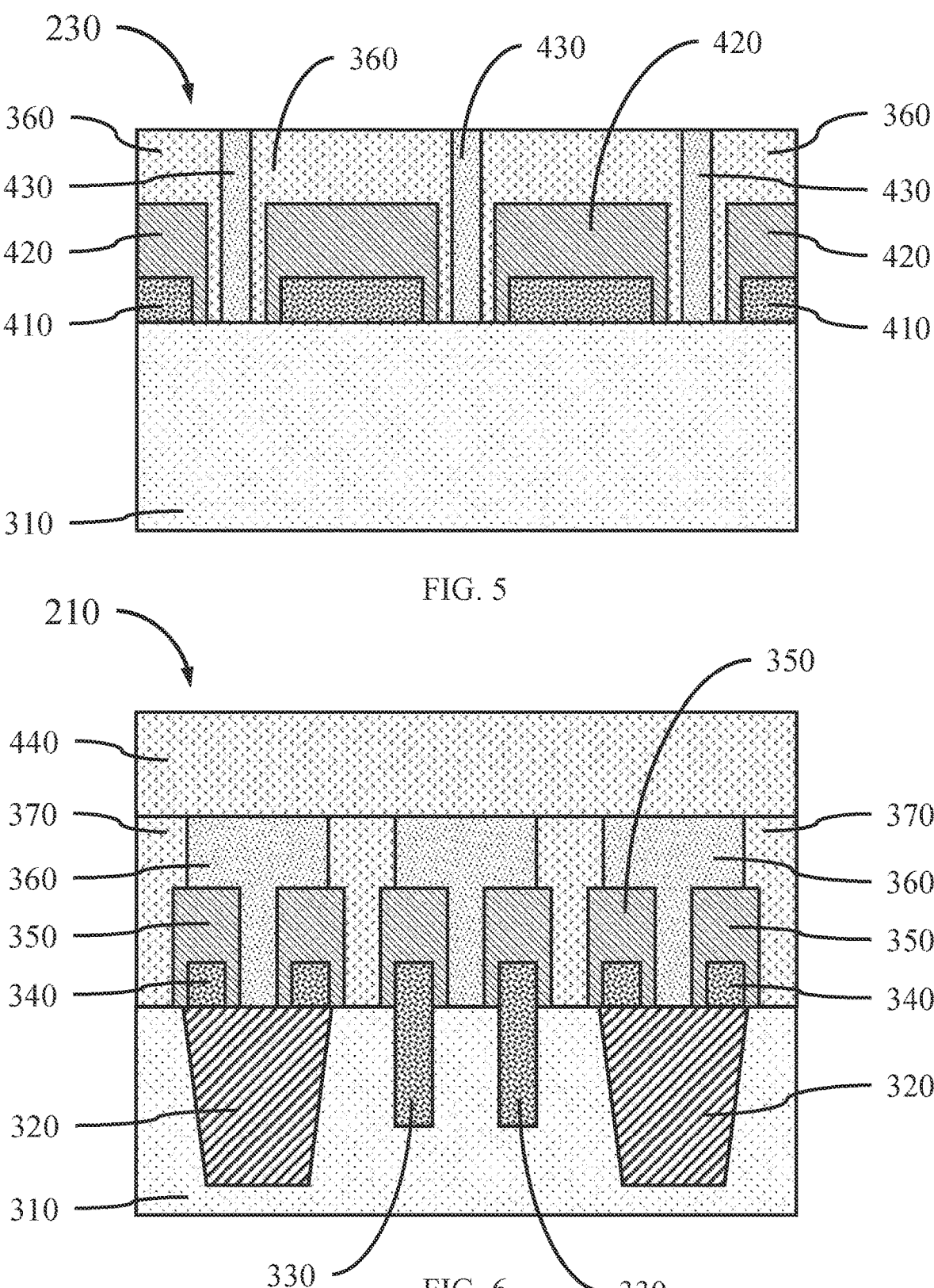
FIG. 5 is a cross-sectional side view showing a region of non-volatile dual/multiple-state memory devices of the stacked high bandwidth memory device, in accordance with an embodiment of the present invention.
FIG. 6 is a cross-sectional side view showing a first interlayer dielectric (ILD) layer formed on the region of dynamic random access memory devices, in accordance with an embodiment of the present invention.

FIG. 5 is a cross-sectional side view showing a region of non-volatile dual/multiple-state memory devices of the stacked high bandwidth memory device, in accordance with an embodiment of the present invention.

In one or more embodiments, the non-volatile memory region 230 can include transistor devices, which includes gate 410 and gate spacer/dielectric cap 420. A dielectric fill 360 can be formed on the transistors, and source/drain contact(s) 430 can be formed to the transistor devices through the dielectric fill 360. In various embodiments, the transistor device(s) can be planar transistors, FinFET transistors, nanosheet transistors, nanowire transistors, and combinations thereof.

FIG. 6 is a cross-sectional side view showing a first interlayer dielectric (ILD) layer formed on the region of dynamic random access memory devices, in accordance with an embodiment of the present invention.

In one or more embodiments, a first interlayer dielectric (ILD) layer 440 can be formed on the region of dynamic random access memory devices 210, where the first interlayer dielectric (ILD) layer 440 can be formed by a blanket deposition, for example, chemical vapor deposition (CVD) or plasma enhanced chemical vapor deposition (PECVD).

In various embodiments, the first interlayer dielectric (ILD) layer 440 can be a low-k dielectric material, including, but not limited to, carbon doped silicon oxide (SiO:C, CDO), fluorine doped silicon oxide (SiO:F), porous silicon dioxide (p-SiO$_2$), spin-on dielectric materials (e.g., hydrogen silsesquioxane, methylsilsesquioxane, etc.), other dielectric materials with a k value<3.9, and combinations thereof.

In various embodiments, the first interlayer dielectric (ILD) layer 440 can have a thickness in a range of about 40 nanometers (nm) to about 500 nm, or about 60 nm to about 100 nm, although other thicknesses are also contemplated.

Figures 7, 8:
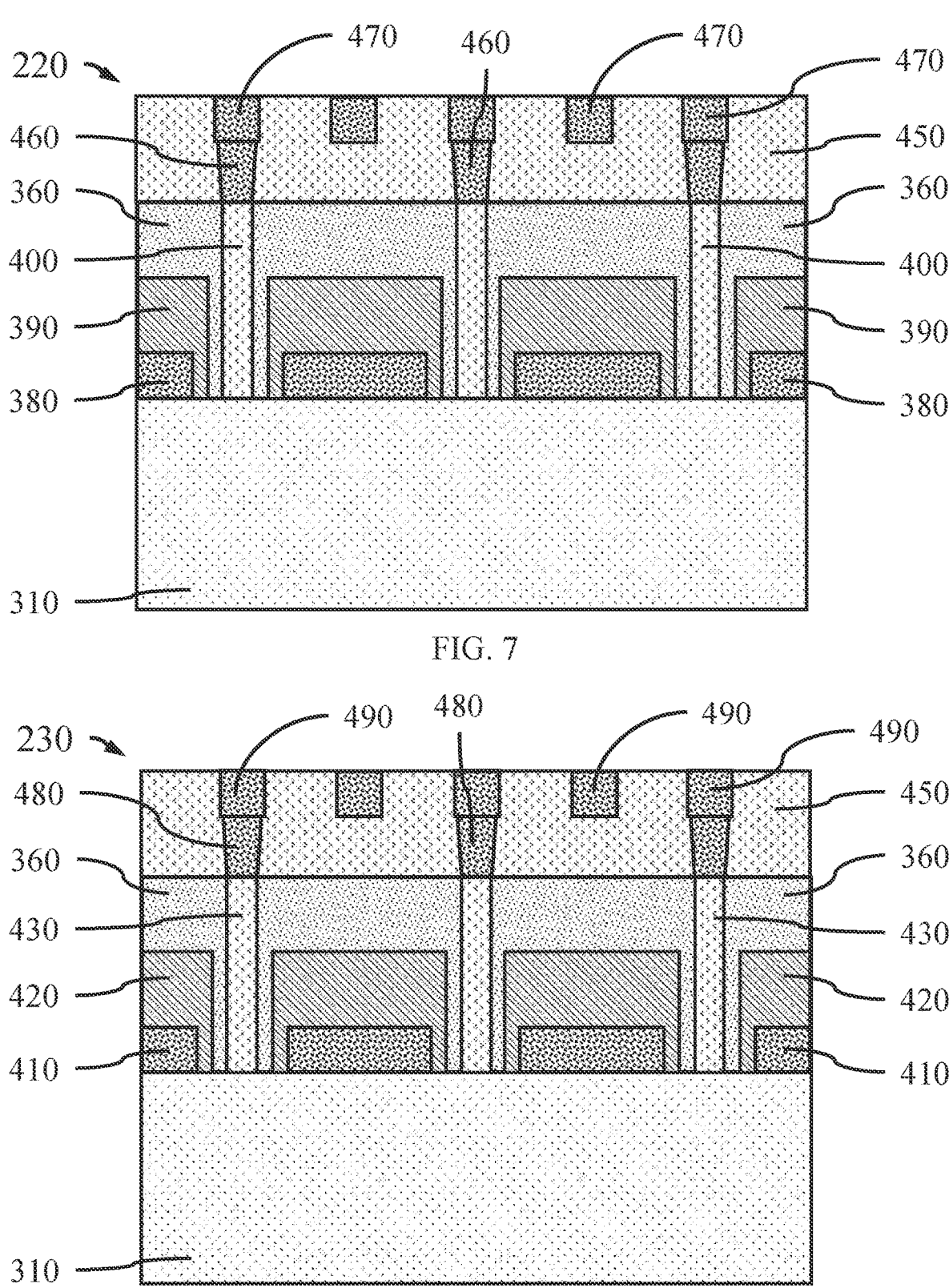
FIG. 7 is a cross-sectional side view showing the first interlayer dielectric (ILD) layer on the region of logic devices, and a lower metallization layer in the first ILD layer, in accordance with an embodiment of the present invention.
FIG. 8 is a cross-sectional side view showing the first interlayer dielectric (ILD) layer on the region of non-volatile dual/multiple-state memory devices, and a lower metallization layer in the first ILD layer, in accordance with an embodiment of the present invention.

FIG. 7 is a cross-sectional side view showing the first interlayer dielectric (ILD) layer on the region of logic devices, and a lower metallization layer in the first ILD layer, in accordance with an embodiment of the present invention.

In one or more embodiments, a portion 450 of the first interlayer dielectric (ILD) layer 440 can be formed on the region of logic devices 220, where the portion 450 of the first interlayer dielectric (ILD) layer 440 can be formed by a blanket deposition at the same time as the first interlayer dielectric (ILD) layer 440 formed on the region of dynamic random access memory devices 210. The ILD layer 440 can be formed by a single deposition on each of the region of dynamic random access memory devices 210, region of logic devices 220, and non-volatile memory region 230, at the same time.

In various embodiments, the portion 450 of the first interlayer dielectric (ILD) layer 440 can have a thickness in a range of about 40 nanometers (nm) to about 500 nm, or about 60 nm to about 100 nm, although other thicknesses are also contemplated. The thickness of the portion 450 of the first interlayer dielectric (ILD) layer 440 can have the same thickness as the first interlayer dielectric (ILD) layer 440 formed on the region of dynamic random access memory devices 210.

In various embodiments, a lower metallization layer, including, but not limited to, one or more metal lines 470 and one or more via(s) 460 can be formed in the portion 450 of the first ILD layer 440 on the region of logic devices, where the metal lines 470 and via(s) 460 may be formed by a damascene or dual damascene type deposition process.

In various embodiments, the metal lines 470 and via(s) 460 can be made of a conductive metal, for example, tungsten (W), cobalt (Co), molybdenum (Mo), copper (Cu), tantalum (Ta), and/or a metal compound, for example, titanium nitride (TiN), titanium carbide (TiC), tantalum nitride (TaN), tantalum carbide (TaC), tungsten nitride (WN), and combinations thereof.

FIG. 8 is a cross-sectional side view showing the first interlayer dielectric (ILD) layer on the region of non-volatile dual/multiple-state memory devices, and a lower metallization layer in the first ILD layer, in accordance with an embodiment of the present invention.

In various embodiments, a lower metallization layer, including, but not limited to, one or more metal lines 490 and one or more via(s) 480 can be formed in the portion 450 of the first ILD layer 440 on the region of non-volatile dual/multiple-state memory devices, where the metal lines 490 and metal line(s) 480 may be formed by a damascene or dual damascene type deposition process.

In various embodiments, the metal lines 490 and metal line(s) 480 can be made of a conductive metal, for example, tungsten (W), cobalt (Co), molybdenum (Mo), copper (Cu), tantalum (Ta), and/or a metal compound, for example, titanium nitride (TiN), titanium carbide (TiC), tantalum nitride (TaN), tantalum carbide (TaC), tungsten nitride (WN), and combinations thereof.

Figures 9, 10:
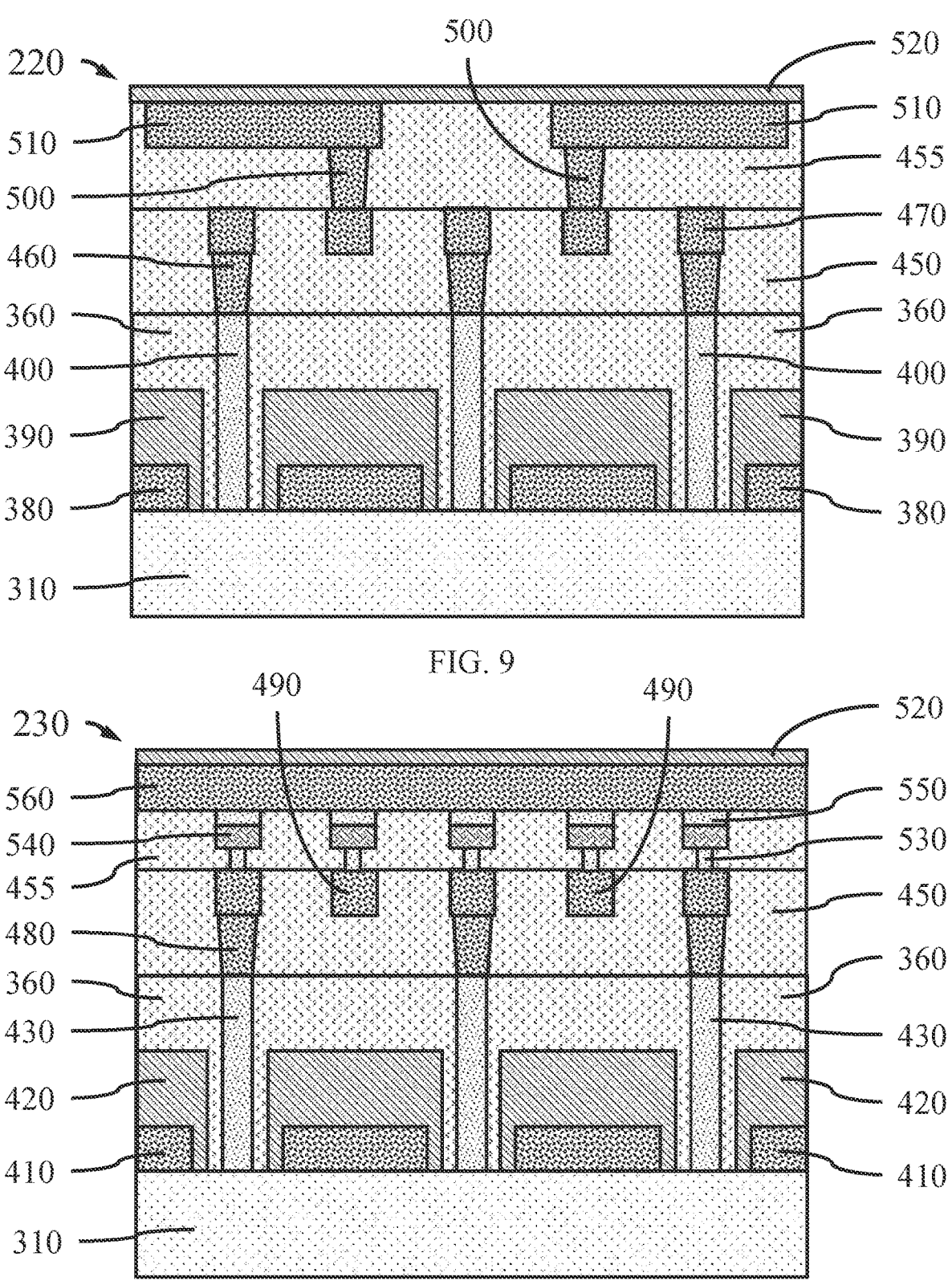
FIG. 9 is a cross-sectional side view showing a second interlayer dielectric (ILD) layer over the first interlayer dielectric (ILD) layer on the region of logic devices, and an upper metallization layer in the second ILD layer, in accordance with an embodiment of the present invention.
FIG. 10 is a cross-sectional side view showing a second interlayer dielectric (ILD) layer over the first interlayer dielectric (ILD) layer on the region of non-volatile dual/multiple-state memory devices, and a plurality of non-volatile memory devices and an upper metallization layer in the second ILD layer, in accordance with an embodiment of the present invention.

FIG. 9 is a cross-sectional side view showing a second interlayer dielectric (ILD) layer over the first interlayer dielectric (ILD) layer on the region of logic devices, and an upper metallization layer in the second ILD layer, in accordance with an embodiment of the present invention.

In various embodiments, a second interlayer dielectric (ILD) layer 455 can be formed on the portion 450 of the first interlayer dielectric (ILD) layer 440, where the second interlayer dielectric (ILD) layer 455 can be formed by a blanket deposition over the logic region 220. The second interlayer dielectric (ILD) layer 455 can cover the top surfaces of the the the metal line(s) 470.

In various embodiments, an upper metallization layer, including, but not limited to, one or more metal lines 510 and one or more via(s) 500 can be formed in the second ILD layer 455, where the metal lines 510 and via(s) 500 may be formed by a damascene or dual damascene type deposition process.

In various embodiments, the second interlayer dielectric (ILD) layer 455 can have a thickness in a range of about 40 nanometers (nm) to about 500 nm, or about 60 nm to about 100 nm, although other thicknesses are also contemplated.

In various embodiments, the second interlayer dielectric (ILD) layer 455 can be a low-k dielectric material, where the second interlayer dielectric (ILD) layer 455 may be the same dielectric material as first interlayer dielectric (ILD) layer 440 and portion 450 of the first interlayer dielectric (ILD) layer 440.

In one or more embodiments, a cover layer 520 can be formed on the second ILD layer 455, where the cover layer 520 can act as an etch-stop layer. The cover layer 520 can be formed by a conformal deposition, for example, atomic layer deposition (ALD) or plasma enhanced atomic layer deposition (PEALD) on the metal lines 510 and second ILD layer 455.

In one or more embodiments, the cover layer 520 can be a dielectric layer such as SiCO, SiC, SiN, etc.

In various embodiments, the cover layer 520 can have a thickness in a range of about 3 nanometers (nm) to about 60 nm, or about 10 nm to about 30 nm, although other thicknesses are also contemplated.

FIG. 10 is a cross-sectional side view showing a second interlayer dielectric (ILD) layer over the first interlayer dielectric (ILD) layer on the region of non-volatile dual/multiple-state memory devices, and a plurality of non-volatile memory devices and an upper metallization layer in the second ILD layer, in accordance with an embodiment of the present invention.

In various embodiments, the second interlayer dielectric (ILD) layer 455 can be formed on the portion 450 of the first interlayer dielectric (ILD) layer 440 of the non-volatile memory region 230, where the second interlayer dielectric (ILD) layer 455 can be formed by a blanket deposition over the non-volatile memory region 230. The second interlayer dielectric (ILD) layer 455 can cover the top surfaces of the via(s) 480 and the metal line(s) 490.

In various embodiments, one or more non-volatile memory devices can be formed in the second ILD layer 455, where the non-volatile memory devices can include a bottom memory electrode 530, a top memory electrode 550, and a memory material layer 540 between the top memory electrode 550 and bottom memory electrode 530. In various embodiments, the memory material layer 540 can be a resistive memory material or a phase change memory material.

In various embodiments, an upper metallization layer, including, but not limited to, one or more metal lines 560 and one or more via(s) can be formed in the second ILD layer 455, where the metal lines 560 and via(s) may be formed by a damascene or dual damascene type deposition process. The metal line(s) 560 can be on and in electrical connection with the top memory electrode 550 to connect the non-volatile memory device(s) to additional layers and/or contacts. The bottom memory electrode 530 can connect the non-volatile memory devices to one or more transistor devices 420 in the non-volatile memory region 230.

In various embodiments, the second interlayer dielectric (ILD) layer 455 can have a thickness in a range of about 40 nanometers (nm) to about 500 nm, or about 60 nm to about 100 nm, although other thicknesses are also contemplated.

In one or more embodiments, the cover layer 520 can be formed on the second ILD layer 455 over the non-volatile memory region(s) 230, where the cover layer 520 can act as an etch-stop layer.

Figure 11:
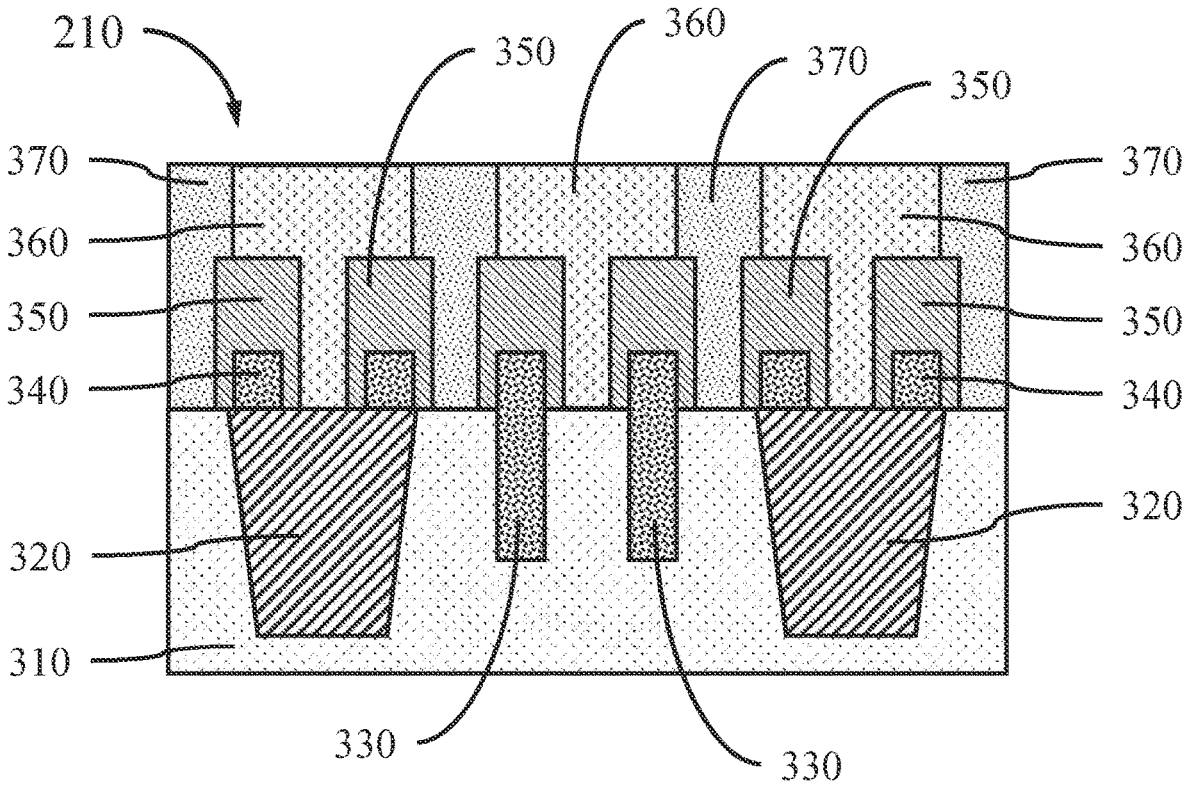
FIG. 11 is a cross-sectional side view showing a region of dynamic random access memory devices of a stacked high bandwidth memory device, in accordance with an embodiment of the present invention.

FIG. 11 is a cross-sectional side view showing a region of dynamic random access memory devices of a stacked high bandwidth memory device, in accordance with an embodiment of the present invention.

In various embodiments, a lithography mask can be used to protect the logic region 220 and non-volatile memory region 230, and the cover layer 520 over the DRAM region 210 is removed. The first ILD layer 440 and second ILD layer 455 can be removed using a selective directional etch, where the first ILD layer 440 and second ILD layer 455 may be the same material and removed at the same time using the same etching process. Removal of the first ILD layer 440 and second ILD layer 455 can expose a top surface of the dielectric fill 360 and Storage Node Contact (SNC) 370.

Figure 12:
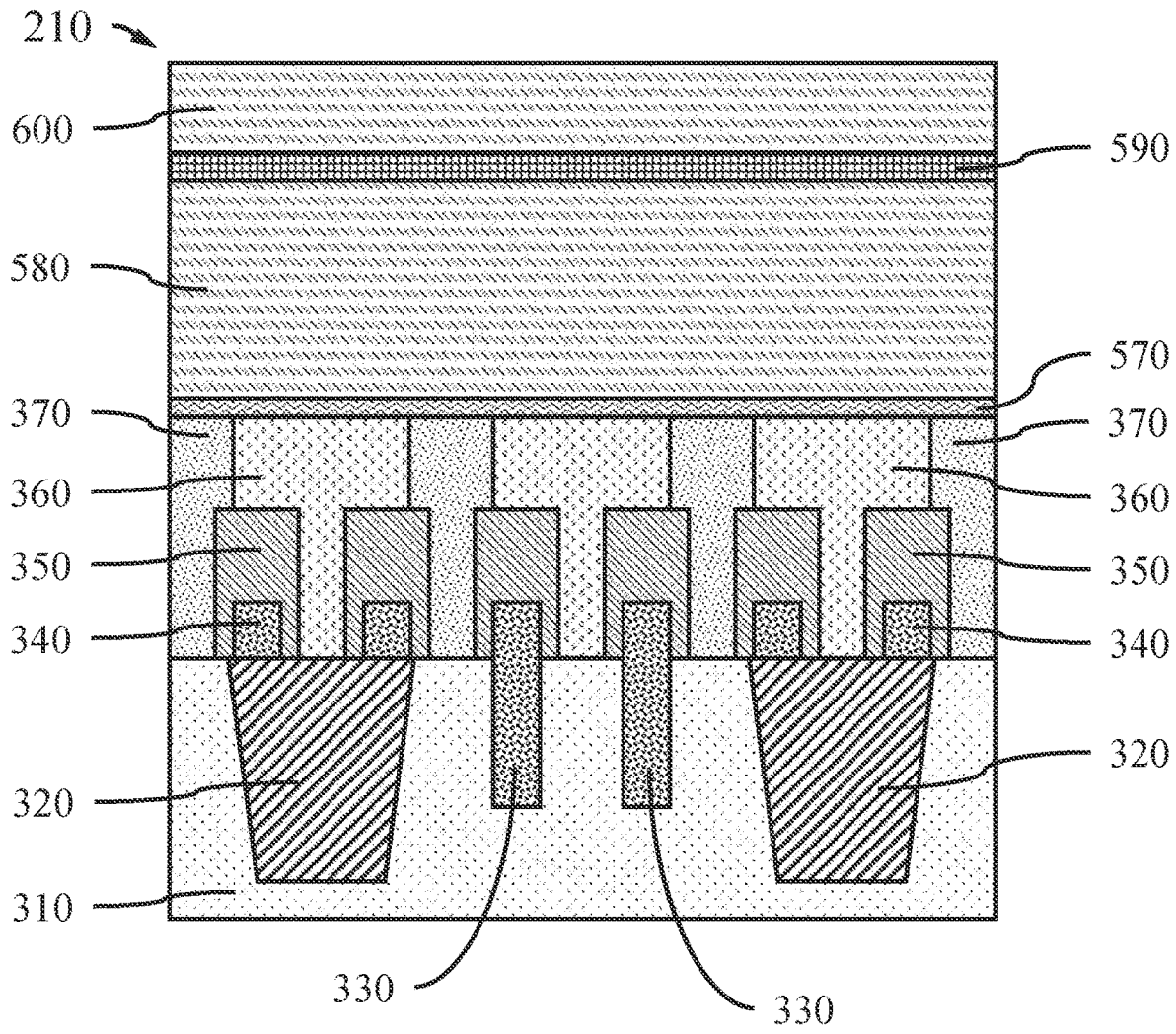
FIG. 12 is a cross-sectional side view showing forming a lower mold layer on a capping layer, a supporting mesh on the lower mold layer, and an upper mold layer on the supporting mesh over the region of dynamic random access memory devices, in accordance with an embodiment of the present invention.

FIG. 12 is a cross-sectional side view showing forming a lower mold layer on a capping layer, a supporting mesh on the lower mold layer, and an upper mold layer on the supporting mesh over the region of dynamic random access memory devices, in accordance with an embodiment of the present invention.

In one or more embodiments, a protective spacer layer 570 can be formed on the top surface of the dielectric fill 360 and electrical connections 370 in the DRAM region(s) 210, where the protective spacer layer 570 can be formed by a conformal deposition (e.g., ALD, PEALD). In various embodiments, the protective spacer layer 570 can be a dielectric material that can act as an etch-stop layer, for example, SiOC, SiC, SiN, AlNx, AlOx, etc. The protective spacer layer 570 can cover the underlying dielectric fill 360.

In various embodiments, the protective spacer layer 570 can have a thickness in a range of about 3 nanometers (nm) to about 100 nm, or about 10 nm to about 30 nm, although other thicknesses are also contemplated.

In one or more embodiments, a lower mold layer 580 can be formed on the protective spacer layer 570, where the mold layer 580 can be formed by a blanket deposition. In various embodiments, the lower mold layer 580 can be a dielectric oxide material, for example, SiO, SiOC, AlOx, etc, that is different from the material of the protective spacer layer 570, such that the lower mold layer 580 can be selectively removed as a sacrificial layer, while the protective spacer layer 570 acts as an etch stop and protects the underlying layers.

In various embodiments, the lower mold layer 580 can have a thickness in a range of about 200 nm to about 3000 nm, or about 400 nm to about 1500 nm, although other thicknesses are also contemplated.

In one or more embodiments, a supporting mesh 590 can be formed on the lower mold layer 580, where the supporting mesh 590 can be formed by a blanket deposition. The supporting mesh 590 can be a dielectric oxide material, for example, SiO, SiOC, AlOx, etc, that is different from the material of the lower mold layer 580, such that the lower mold layer 580 can be selectively removed as a sacrificial layer, while the supporting mesh 590 remains.

In various embodiments, the supporting mesh 590 can have a thickness in a range of about 5 nm to about 100 nm, or about 15 nm to about 50 nm, although other thicknesses are also contemplated.

In one or more embodiments, an upper mold layer 600 can be formed on the supporting mesh 590, where the upper mold layer 600 can be formed by a blanket deposition. The upper mold layer 600 can be a dielectric oxide material, for example, SiO, SiOC, AlOx, etc, that is different from the material of the supporting mesh 590, so the upper mold layer can be selectively removed. The upper mold layer 600 can be the same material as the lower mold layer 580.

In various embodiments, the upper mold layer 600 can have a thickness in a range of about 10 nm to about 1000 nm, or about 20 nm to about 500 nm, although other thicknesses are also contemplated.

Figure 13:
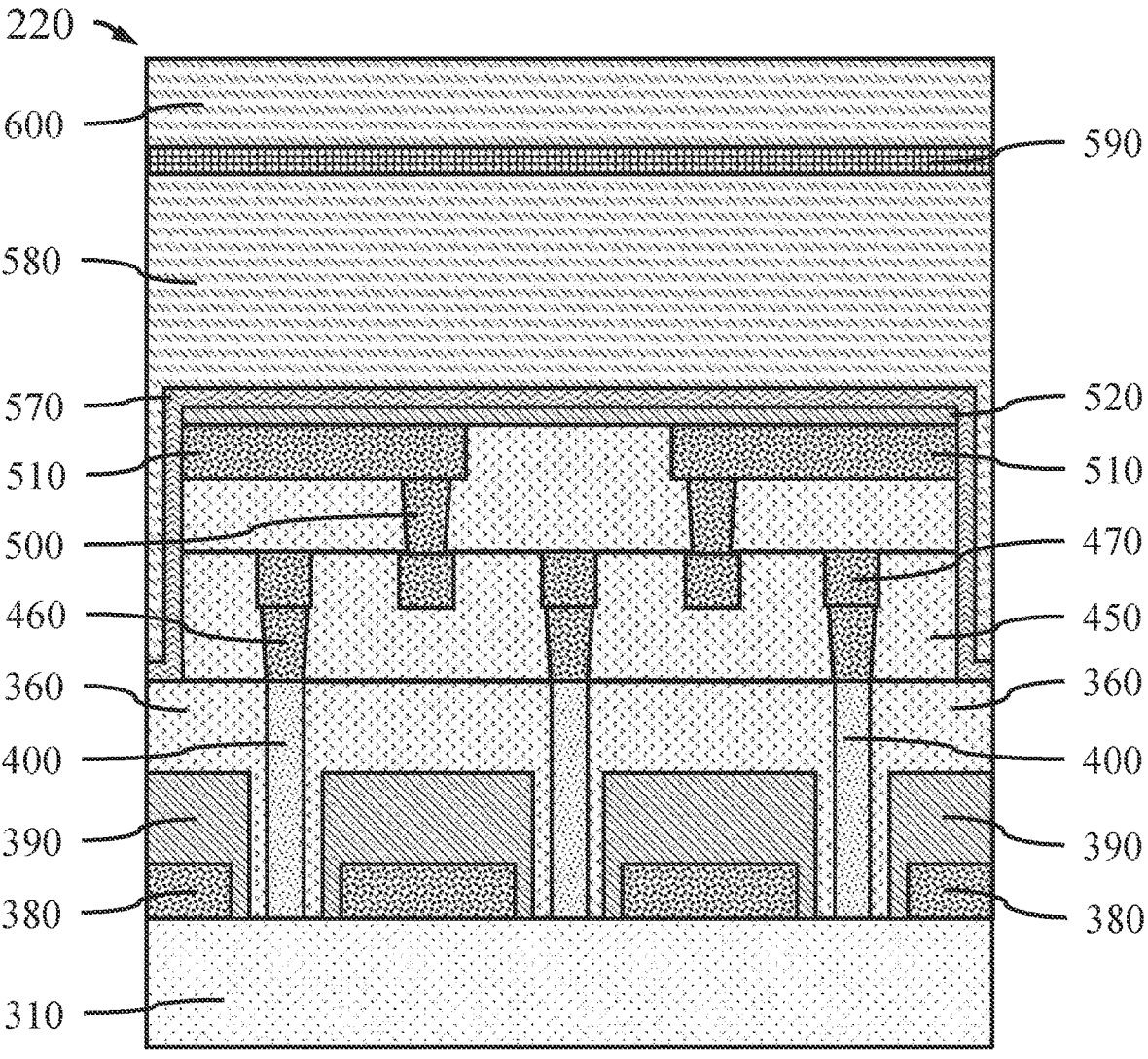
FIG. 13 is a cross-sectional side view showing forming upper and lower mold layer and a supporting mesh on a capping layer over the region of logic devices, in accordance with an embodiment of the present invention.

FIG. 13 is a cross-sectional side view showing forming upper and lower mold layer and a supporting mesh on a capping layer over the region of logic devices, in accordance with an embodiment of the present invention.

In various embodiments, the protective spacer layer 570 can be formed on the cover layer 520 in the logic region 220, where the protective spacer layer 570 can be formed by a conformal deposition (e.g., ALD, PEALD). The protective spacer layer 570 can extend down along the side(s) of the portion 450 of the first interlayer dielectric (ILD) layer 440 and second interlayer dielectric (ILD) layer 455. In various embodiments, the protective spacer layer 570 can be a dielectric material that can act as an etch-stop layer, where the protective spacer layer 570 can be a different dielectric material from the cover layer 520 and lower mold layer 580. In subsequent processes, the upper and lower mold layers can be removed without damaging the ILD layer(s) 450 and 455, which are fully covered by the protective spacer layer 570.

In various embodiments, the lower mold layer 580, supporting mesh 590, and upper mold layer 600 can be formed on the protective spacer layer 570 in the various regions.

Figure 14:
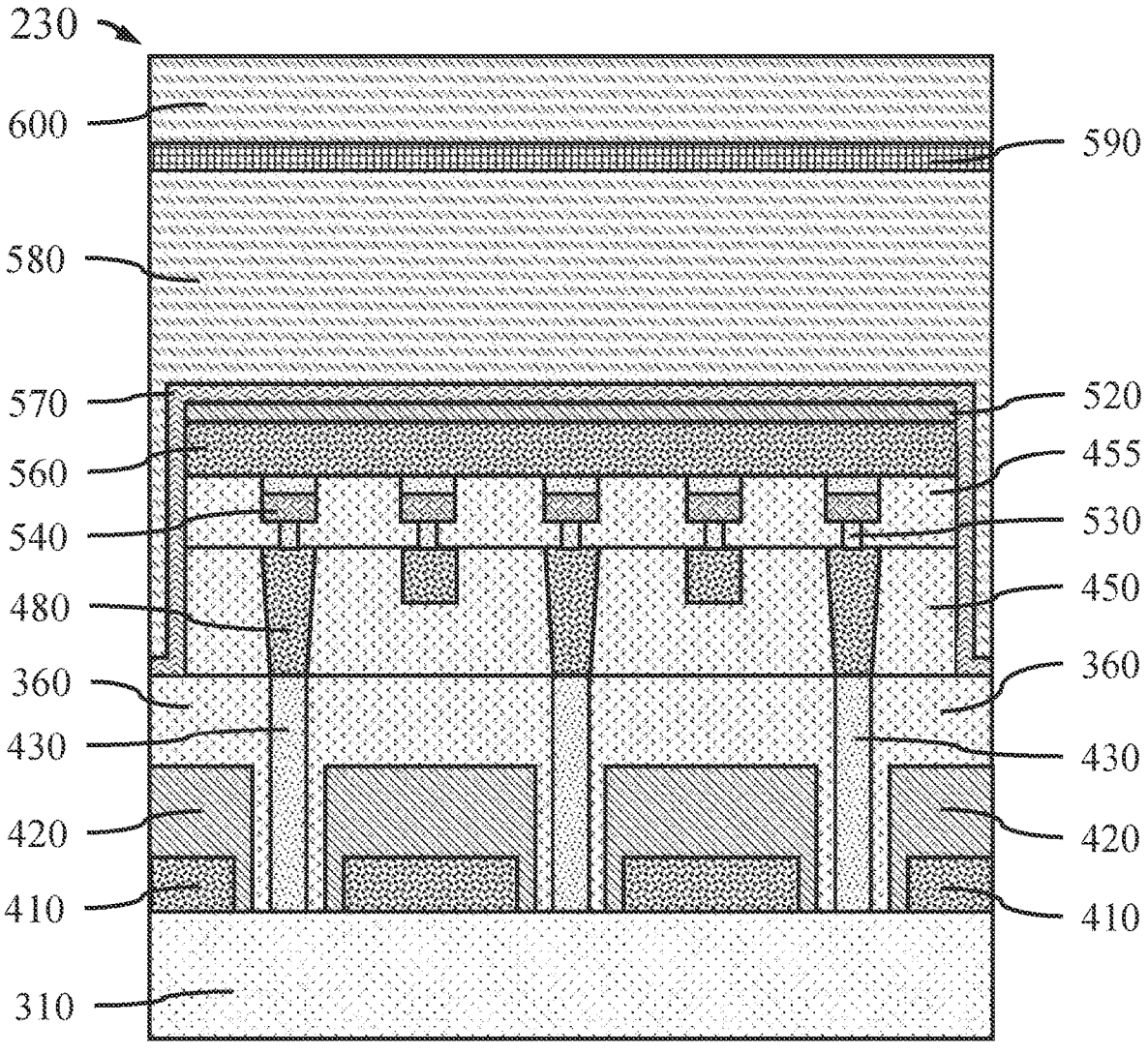
FIG. 14 is a cross-sectional side view showing forming upper and lower mold layers and a supporting mesh on a capping layer over the region of non-volatile memory devices, in accordance with an embodiment of the present invention.

FIG. 14 is a cross-sectional side view showing forming upper and lower mold layers and a supporting mesh on a capping layer over the region of non-volatile memory devices, in accordance with an embodiment of the present invention.

In various embodiments, the protective spacer layer 570 can be formed on the cover layer 520 in the non-volatile memory regions 230, where the protective spacer layer 570 can be formed by a conformal deposition (e.g., ALD, PEALD). The protective spacer layer 570 can extend down along the side(s) of the portion 450 of the first interlayer dielectric (ILD) layer 440 and second interlayer dielectric (ILD) layer 455. The protective spacer layer 570 can electrically insulate the region of non-volatile memory devices 230 from the region of dynamic random access memory devices 210, and from the logic region 220. The protective spacer layer 570 can also protect the BEOL low-k dielectric layers (440, 455 and 450) from being damaged when mold layers 580, 600 are removed in subsequent process steps during DRAM capacitor formation.

In various embodiments, the lower mold layer 580, supporting mesh 590, and upper mold layer 600 can be formed on the protective spacer layer 570 in the various regions.

Figure 15:
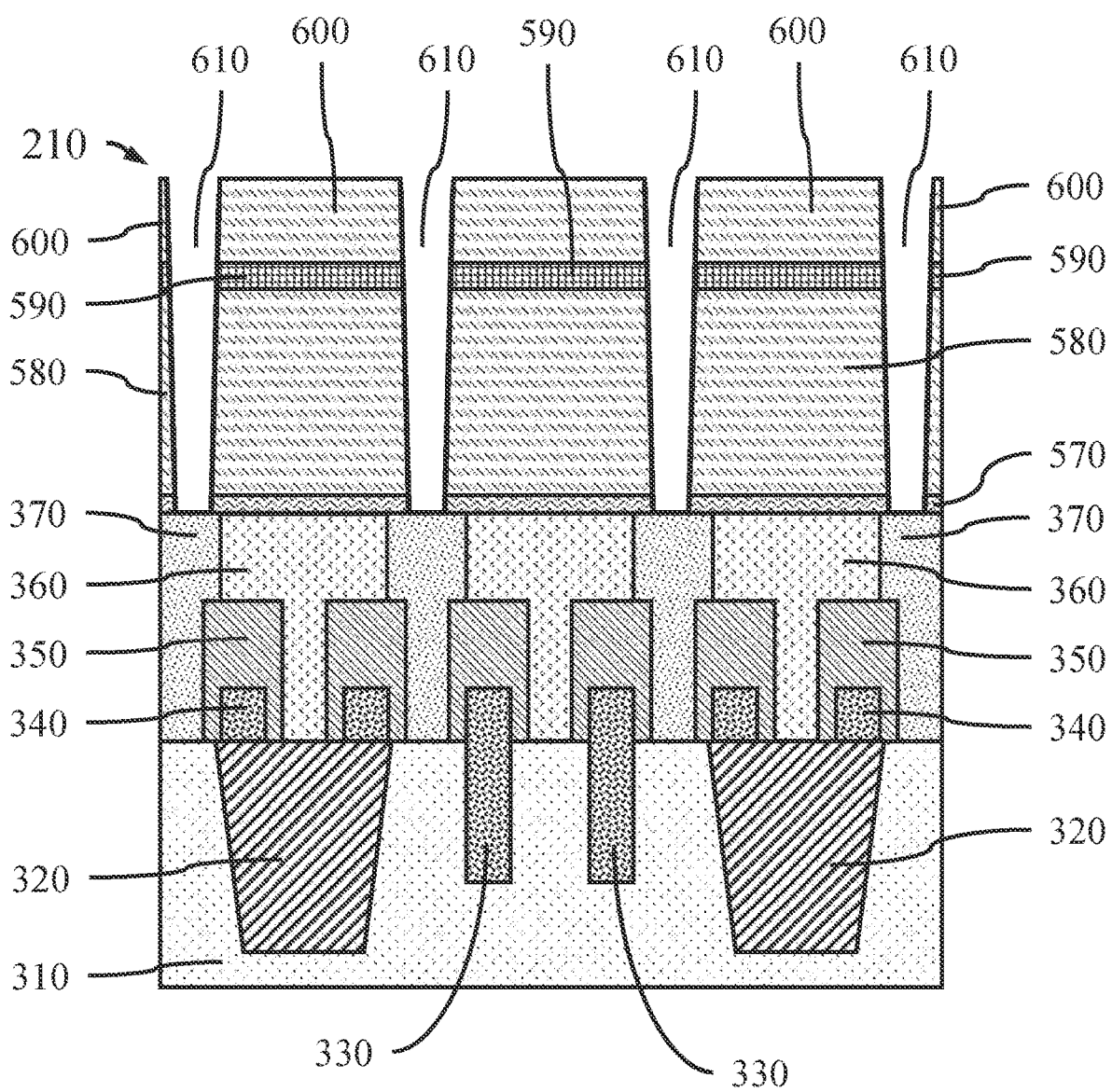
FIG. 15 is a cross-sectional side view showing a plurality of trenches formed through the capping layer, upper and lower mold layers, and the supporting mesh over the region of dynamic random access memory devices, in accordance with an embodiment of the present invention.

FIG. 15 is a cross-sectional side view showing a plurality of trenches formed through the capping layer, upper and lower mold layers, and the supporting mesh over the region of dynamic random access memory devices, in accordance with an embodiment of the present invention.

In one or more embodiments, a plurality of trenches 610 can be formed through the upper mold layer 600, supporting mesh 590, lower mold layer 580, and protective spacer layer 570, where the trenches 610 can be formed by lithographic masking and patterning, and selective directional etching, for example, reactive ion etching (RIE). The trenches 610 can be over and aligned with an underlying storage node contact (SNC) 370.

Figure 16:
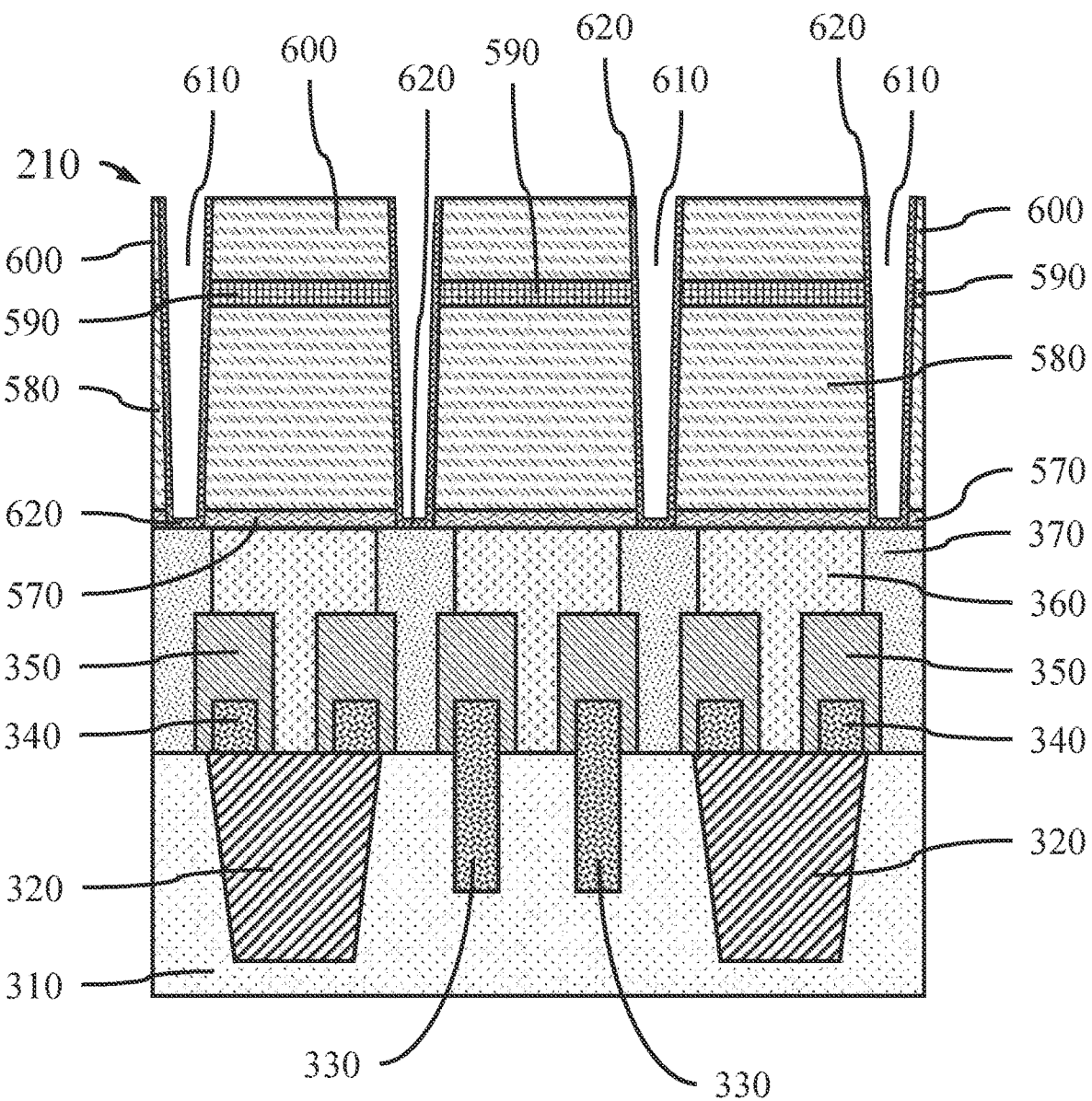
FIG. 16 is a cross-sectional side view showing a bottom capacitor electrode layer formed in the plurality of trenches on the sidewalls of the mold layers and supporting mesh over the region of dynamic random access memory devices, in accordance with an embodiment of the present invention.

FIG. 16 is a cross-sectional side view showing a bottom capacitor electrode layer formed in the plurality of trenches on the sidewalls of the mold layers and supporting mesh over the region of dynamic random access memory devices, in accordance with an embodiment of the present invention.

In one or more embodiments, a bottom capacitor electrode layer 620 can be formed in the plurality of trenches 610, where the bottom capacitor electrode layer 620 can be formed by a conformal deposition. The bottom capacitor electrode layer 620 can be on the sidewalls of the upper mold layer 600, supporting mesh 590, lower mold layer 580, and protective spacer layer 570. A portion of the bottom capacitor electrode layer 620 can be removed from the top surface of the upper mold layer 600 by first depositing a sacrificial material such as OPL into the trenches 610 followed by removing the electrode layer over the top surface by etching, followed by an OPL ash.

In various embodiments, the bottom capacitor electrode layer 620 can be a conductive material, including, but not limited to, a metal, for example, tungsten (W), cobalt (Co), molybdenum (Mo), copper (Cu), tantalum (Ta), and/or a metal compound, for example, titanium nitride (TiN), titanium carbide (TiC), tantalum nitride (TaN), tantalum carbide (TaC), tungsten nitride (WN), and combinations thereof.

In various embodiments, the bottom capacitor electrode layer 620 can have a thickness in a range of about 2 nm to about 5 nm, or about 5 nm to about 15 nm, although other thicknesses are also contemplated.

Figure 17:
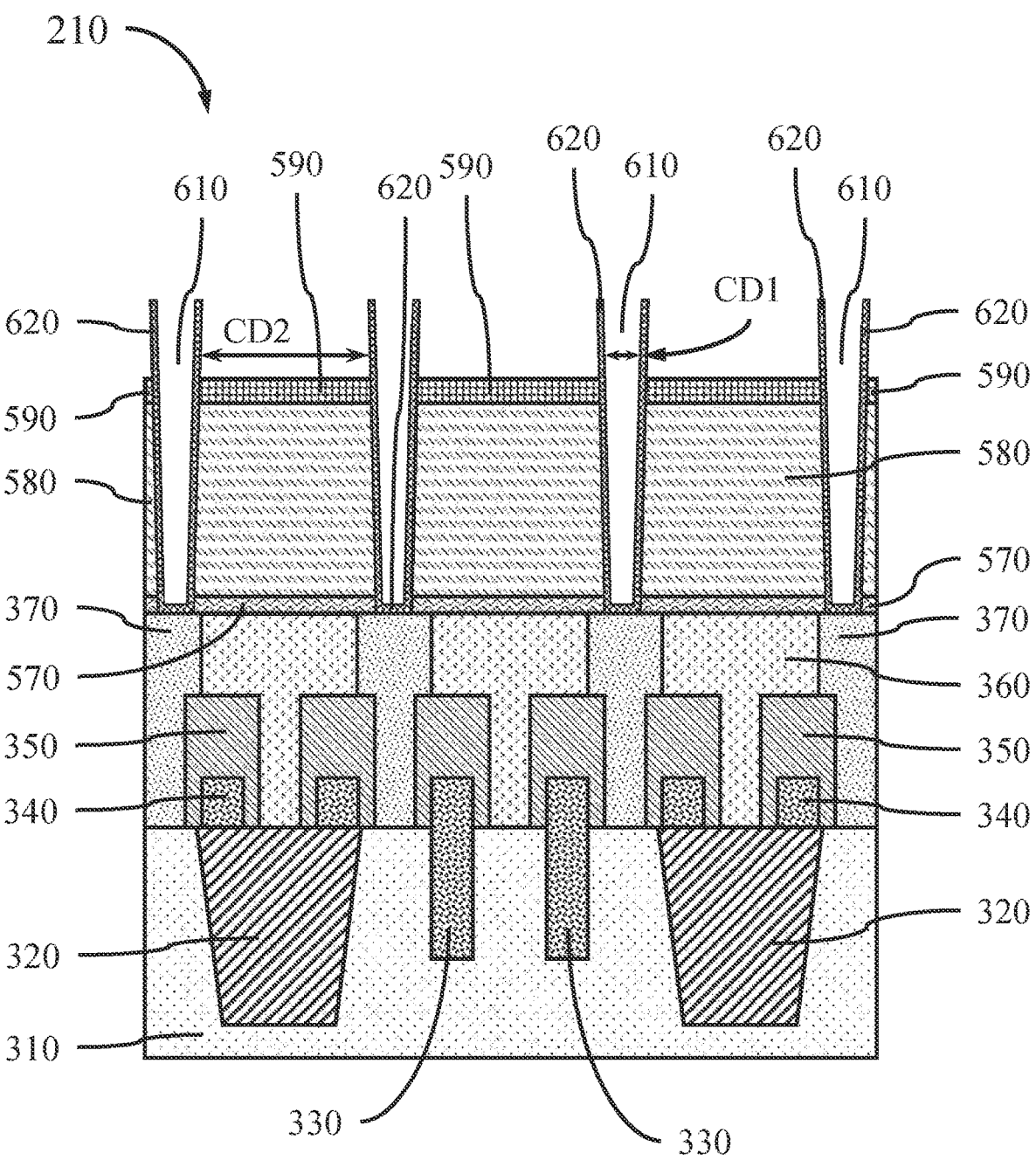
FIG. 17 is a cross-sectional side view showing removal of the upper mold layer on the supporting mesh over the region of dynamic random access memory devices, in accordance with an embodiment of the present invention.

FIG. 17 is a cross-sectional side view showing removal of the upper mold layer on the supporting mesh over the region of dynamic random access memory devices, in accordance with an embodiment of the present invention.

In one or more embodiments, the upper mold layer 600 can be removed using, for example, a selective isotropic etch (e.g., wet chemical etch), where removal of the upper mold layer 600 can expose portions of the supporting mesh 590. Upper sections of the bottom capacitor electrode layer 620 can extend above the supporting mesh 590, where the upper sections of the bottom capacitor electrode layer 620 can be free-standing without other support above the supporting mesh 590. The upper mold layer 600 can be removed from the logic region 220 and non-volatile memory region 230, where the supporting mesh 590 can be exposed.

Figure 18:
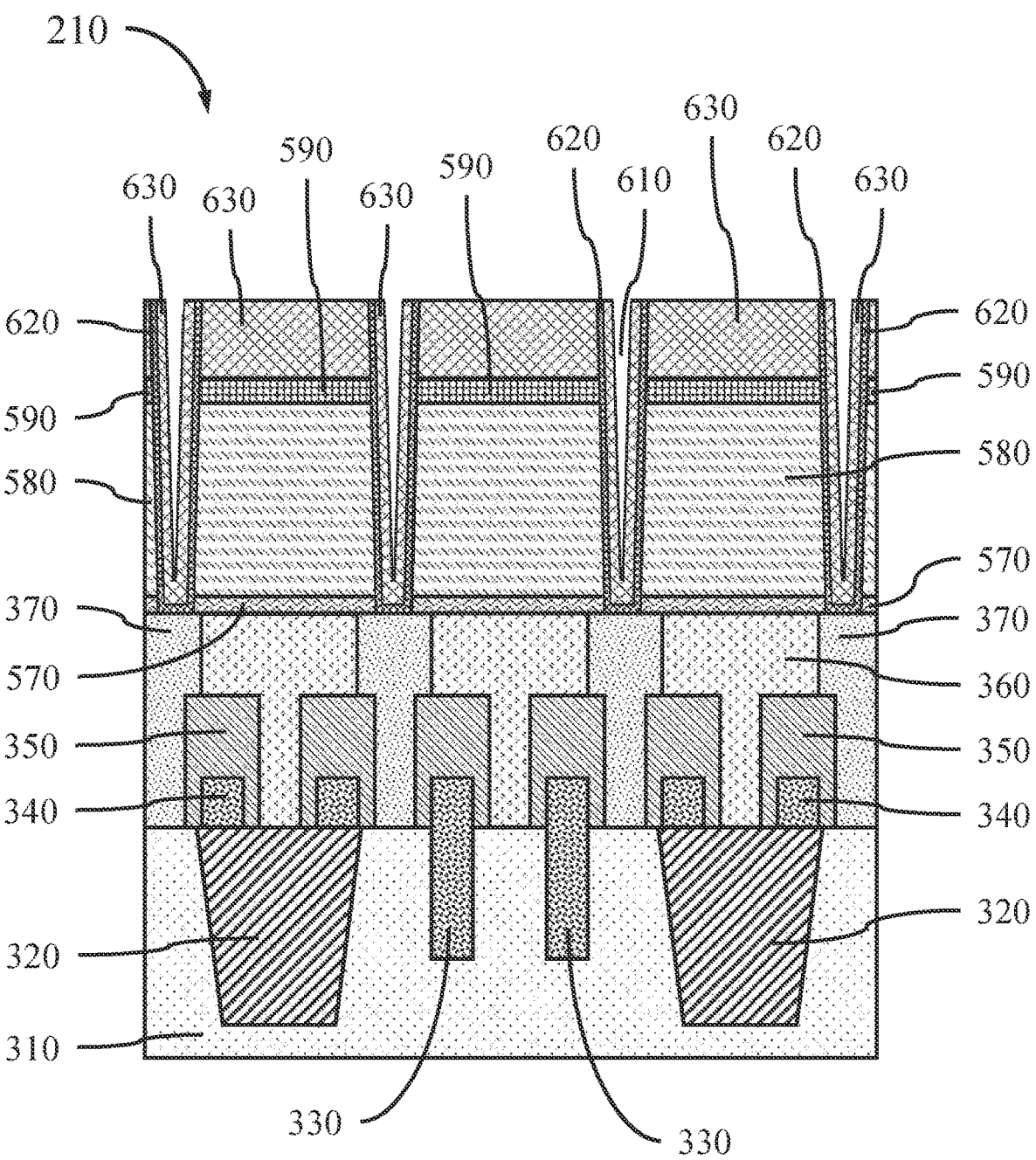
FIG. 18 is a cross-sectional side view showing forming a sacrificial liner on the bottom capacitor electrode layer and on the supporting mesh over the region of dynamic random access memory devices, in accordance with an embodiment of the present invention.

FIG. 18 is a cross-sectional side view showing forming a sacrificial liner on the bottom capacitor electrode layer and on the supporting mesh over the region of dynamic random access memory devices, in accordance with an embodiment of the present invention.

In one or more embodiments, a sacrificial liner 630 can be formed on the bottom capacitor electrode layer 620 and on exposed surfaces of the supporting mesh 590 over the region of dynamic random access memory devices 210. By controlling the thickness of the conformal layer to be >½ of the CD2, the sacrificial layer 630 can pinch-off the space above mesh layer in the DRAM region. A subsequent anisotropic etching of the sacrificial liner can remove the sacrificial liner 630 in the logic and non-volatile memory regions. This allows removal of the exposed mesh layer in the logic and non-volatile memory regions without damaging the mesh layer in DRAM region. Only if CD1>CD2, can the conformal spacer liner pinch-off CD2, without pinching-off the CD1. The process here is a spacer liner deposition followed by spacer RIE to expose the mesh in the logic and non-volatile memory region.

In various embodiments, the sacrificial liner 630 can be a-Si, a-SiGe, AlOx, etc.

In various embodiments, the sacrificial liner 630 can have a thickness in a range of about 5 nm to about 50 nm, or about 10 nm to about 20 nm, although other thicknesses are also contemplated. The thickness of the sacrificial liner 630 can cause the lower sections of the trenches 610 between the bottom capacitor electrode layer 620 to become pinched off.

Figure 19:
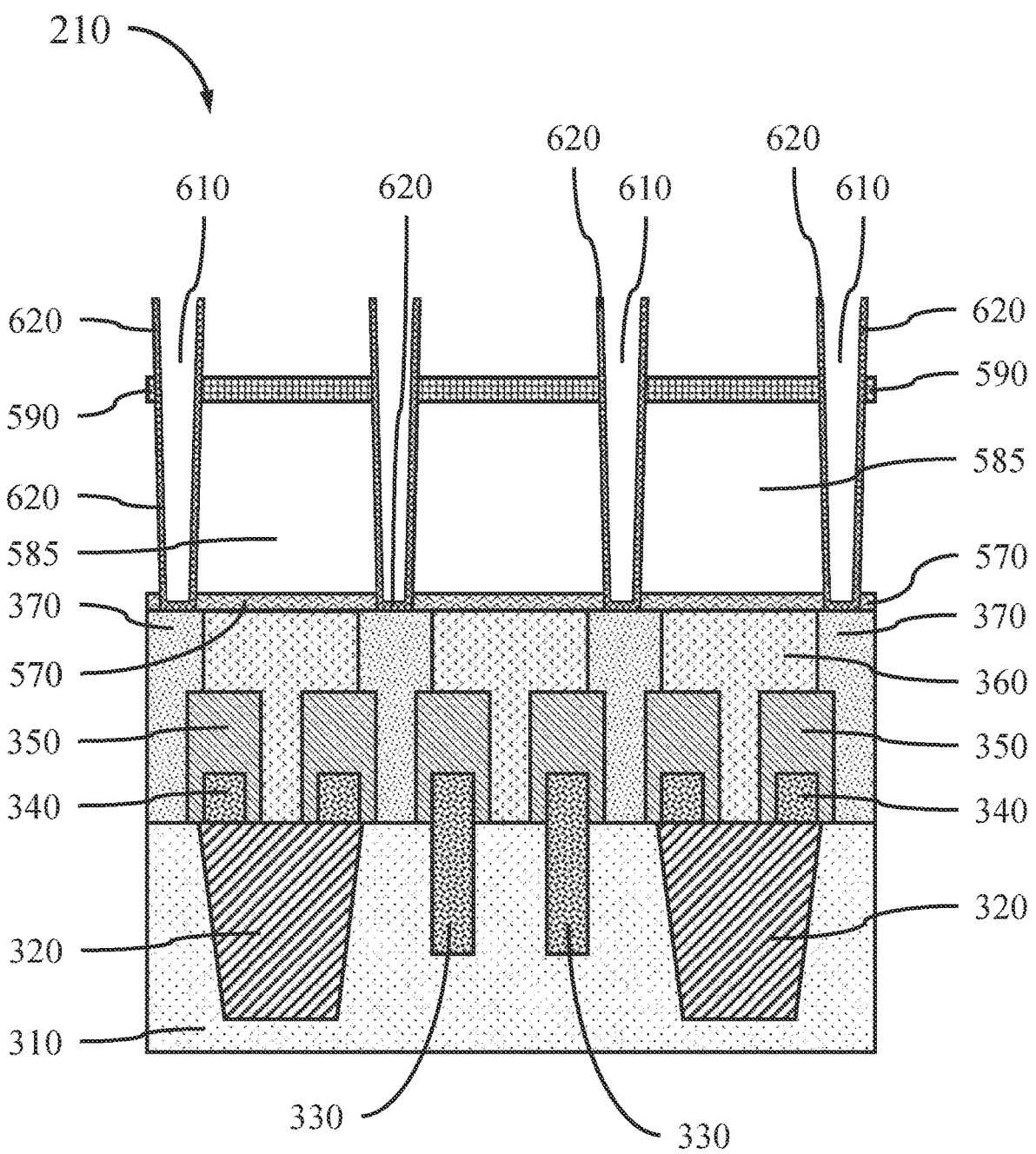
FIG. 19 is a cross-sectional side view showing removal of the sacrificial liner from the trenches and the supporting mesh, and removal of the lower mold layer over the region of dynamic random access memory devices, in accordance with an embodiment of the present invention.

FIG. 19 is a cross-sectional side view showing removal of the sacrificial liner from the trenches and the supporting mesh, and removal of the lower mold layer over the region of dynamic random access memory devices, in accordance with an embodiment of the present invention.

In one or more embodiments, the sacrificial liner 630 and lower mold layer 580 can be removed using, for example, selective isotropic etches. Removal of the lower mold layer 580 can form gaps 585 between the supporting mesh 590 and the protective spacer layer 570 and between sidewalls of the bottom capacitor electrode layer 620. It should be noted that some opening regions in mesh layer can be formed, where the sacrificial liner is not pinched-off (not shown), so mold layer 580 can be accessed during the isotropic etch process.

Figure 20:
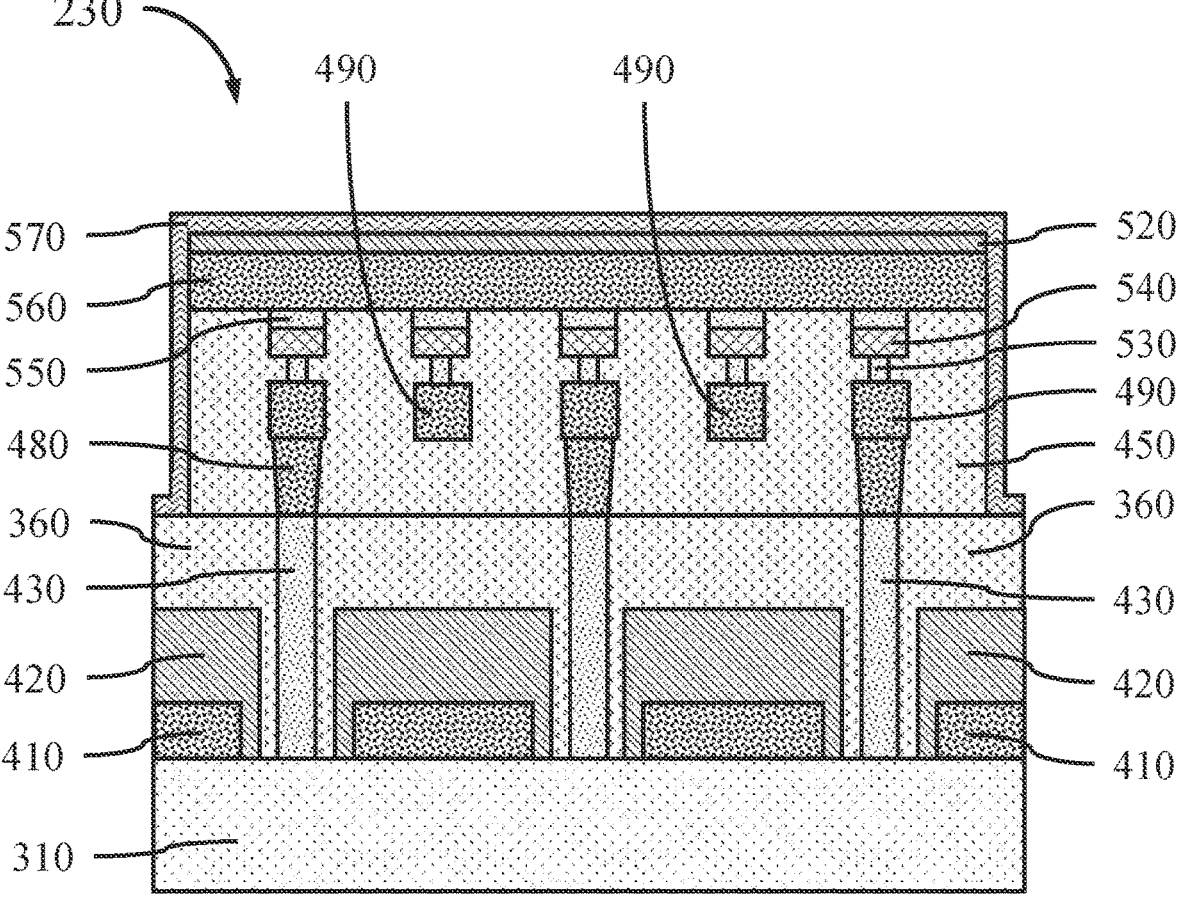
FIG. 20 is a cross-sectional side view showing removal of the upper and lower mold layers and the supporting mesh from the region of non-volatile memory devices, in accordance with an embodiment of the present invention.

FIG. 20 is a cross-sectional side view showing removal of the upper and lower mold layers and the supporting mesh from the region of non-volatile memory devices, in accordance with an embodiment of the present invention.

Removal of the sacrificial liner 630 and lower mold layer 580 can expose the protective spacer layer 570 in the non-volatile memory regions 230.

Figure 21:
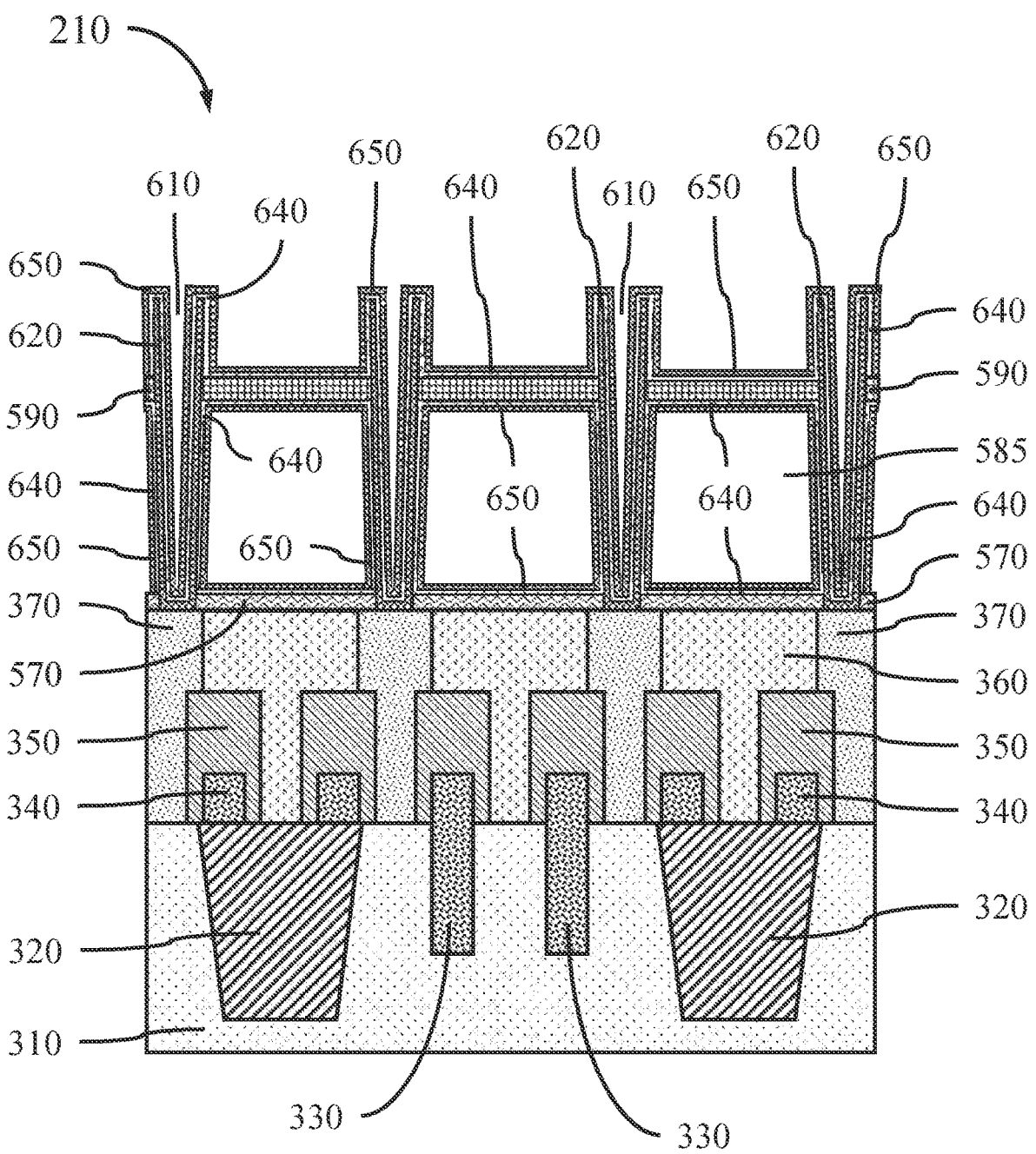
FIG. 21 is a cross-sectional side view showing formation of a capacitor dielectric layer on the bottom capacitor electrode layer and the surfaces of the supporting mesh, and a top capacitor electrode layer formed on the capacitor dielectric layer, in accordance with an embodiment of the present invention.

FIG. 21 is a cross-sectional side view showing formation of a capacitor dielectric layer on the bottom capacitor electrode layer and the surfaces of the supporting mesh, and a top capacitor electrode layer formed on the capacitor dielectric layer, in accordance with an embodiment of the present invention.

In one or more embodiments, a capacitor dielectric layer 640 can be formed on the bottom capacitor electrode layer 620, where the capacitor dielectric layer 640 can be formed by a conformal deposition (e.g., ALD, PEALD).

Examples of material for the dielectric layer 640 include: $Al_2O_3$, $ZrO_2$, $Y_2O_3$, $HfO_2$, $Ta_2O_5$, TiOx, $BaHfO_2$, CoTiOx, $SrTiO_3$, etc.

In various embodiments, the capacitor dielectric layer 640 can have a thickness in a range of about 1 nanometers (nm) to about 50 nm, or about 6 nm to about 20 nm, although other thicknesses are also contemplated.

In one or more embodiments, a top capacitor electrode layer 650 can be formed on the capacitor dielectric layer 640, where the capacitor dielectric layer 640 can be formed by a conformal deposition (e.g., ALD, PEALD). The top capacitor electrode layer 650 can be made of the same material as the bottom capacitor electrode layer 620.

In various embodiments, the top capacitor electrode layer 650 can have a thickness in a range of about 2 nm to about 50 nm, or about 3 nm to about 15 nm, although other thicknesses are also contemplated. The capacitor dielectric layer 640 and top capacitor electrode layer 650 can leave gaps 585 surrounded by the top capacitor electrode layer 650.

Figure 22:
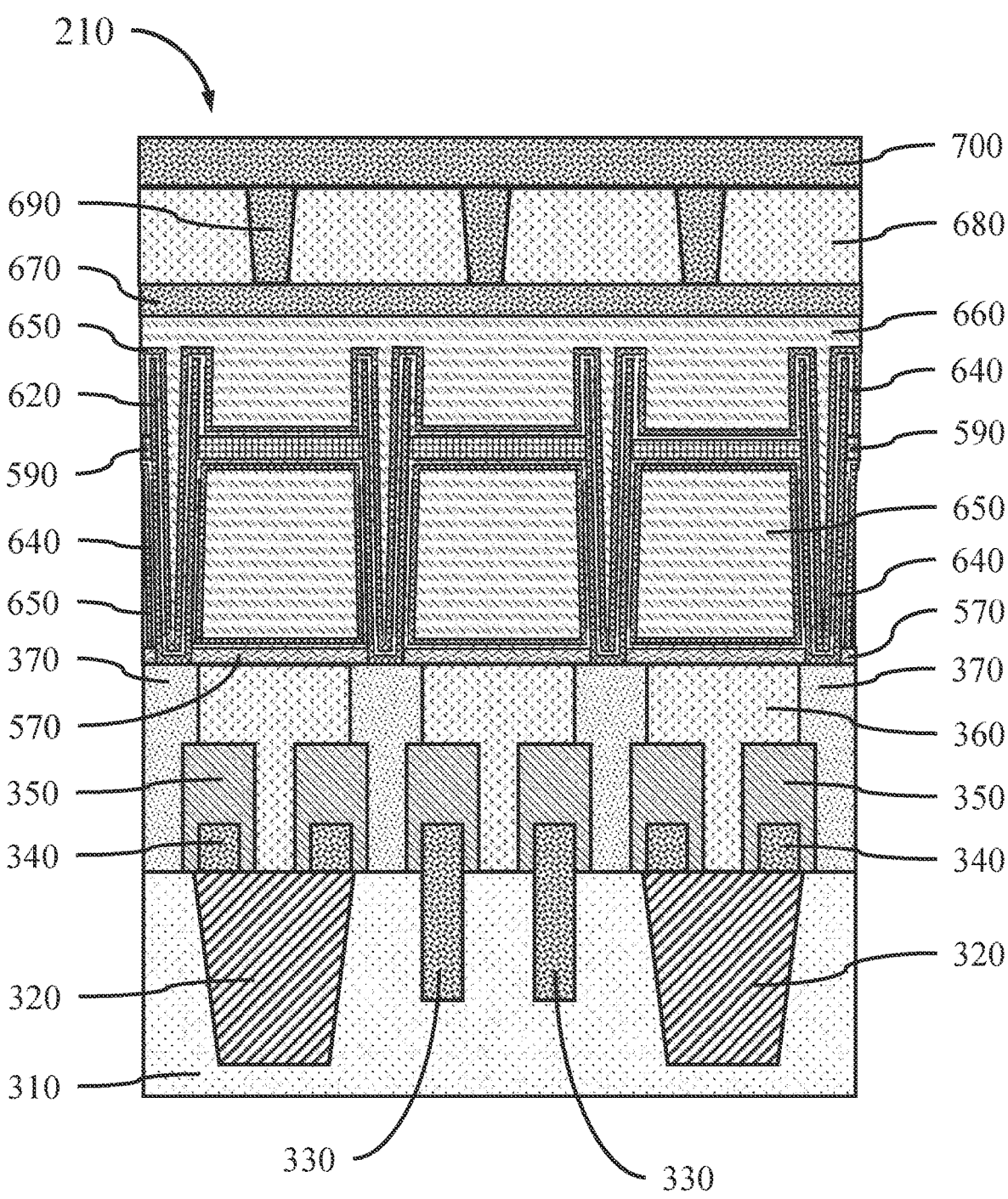
FIG. 22 is a cross-sectional side view showing formation of a fill layer on the top capacitor electrode layer, a capacitor top plate formed on the fill layer, and a second interlayer dielectric (ILD) layer with a metallization layer formed on the capacitor top plate, in accordance with an embodiment of the present invention.

FIG. 22 is a cross-sectional side view showing formation of a fill layer on the top capacitor electrode layer, a capacitor top plate formed on the fill layer, and a second interlayer dielectric (ILD) layer with a metallization layer formed on the capacitor top plate, in accordance with an embodiment of the present invention.

In one or more embodiments, a fill layer 660 can be formed on the top capacitor electrode layer 650 and in gaps 585, where the fill layer 660 can be formed by for example, chemical vapor deposition (CVD) to form poly-Si or poly-SiGe.

In one or more embodiments, a capacitor top plate 670 can be formed on the fill layer 660, where the capacitor top plate 670 can be formed by CVD, ALD, or PVD metal deposition processes.

In one or more embodiments, a second interlayer dielectric (ILD) layer 680 can be formed on the capacitor top plate 670, and a top metal line 700 and metal via 690 formed in the second interlayer dielectric (ILD) layer 680. The top metal line 700 and metal via 690 can be electrically connected to the capacitor top plate 670.

Figure 23:
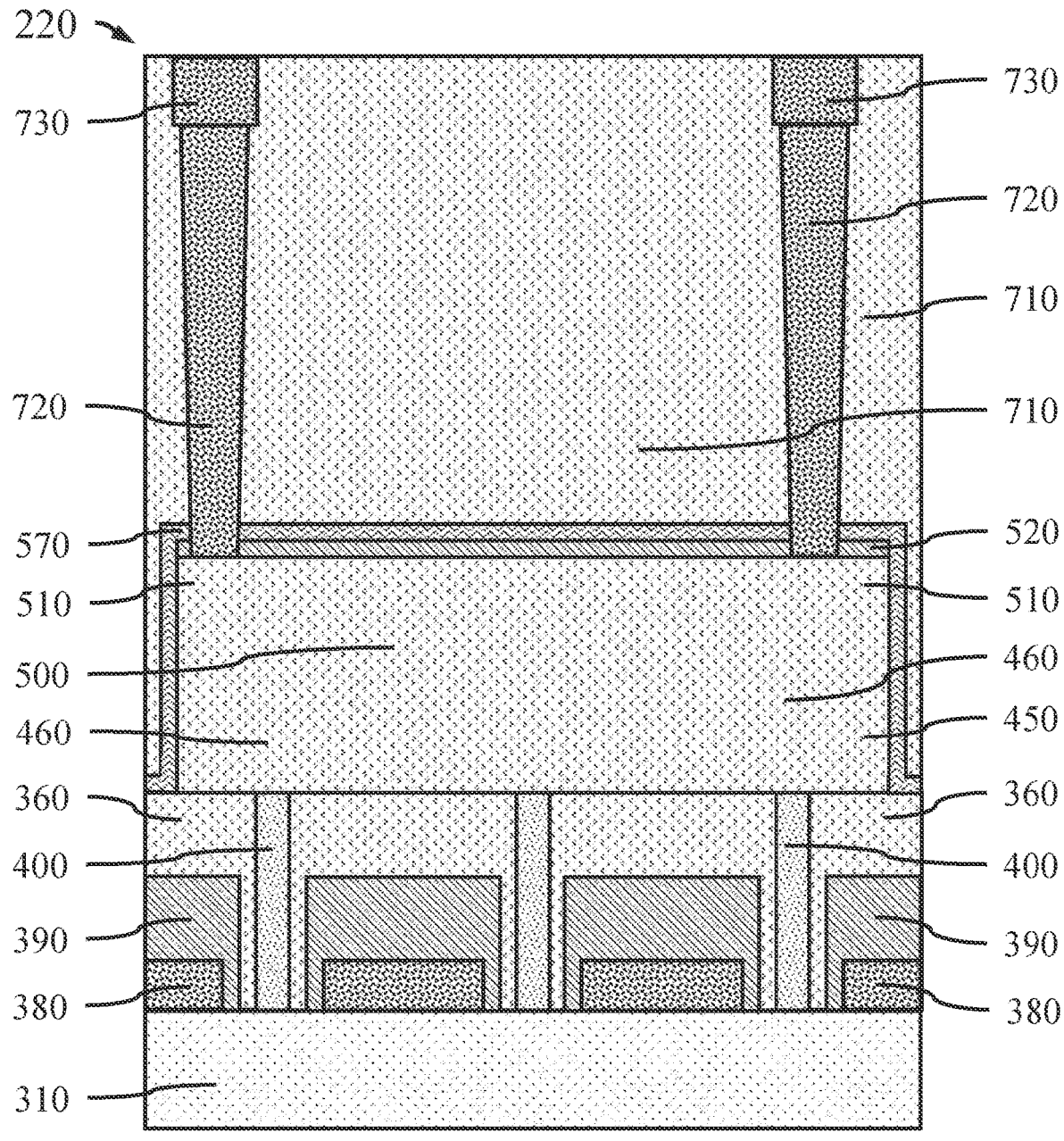
FIG. 23 is a cross-sectional side view showing a second interlayer dielectric (ILD) layer with a metallization layer formed through the protective spacer layer over the region of logic devices, in accordance with an embodiment of the present invention.

FIG. 23 is a cross-sectional side view showing a second interlayer dielectric (ILD) layer with a metallization layer formed through the protective spacer layer over the region of logic devices, in accordance with an embodiment of the present invention.

In one or more embodiments, a portion 710 of the second interlayer dielectric (ILD) layer 680 with a metallization layer, including via(s) 720 and metal lines 730, can be formed through the protective spacer layer 570 over the region of logic devices 220.

Figure 24:
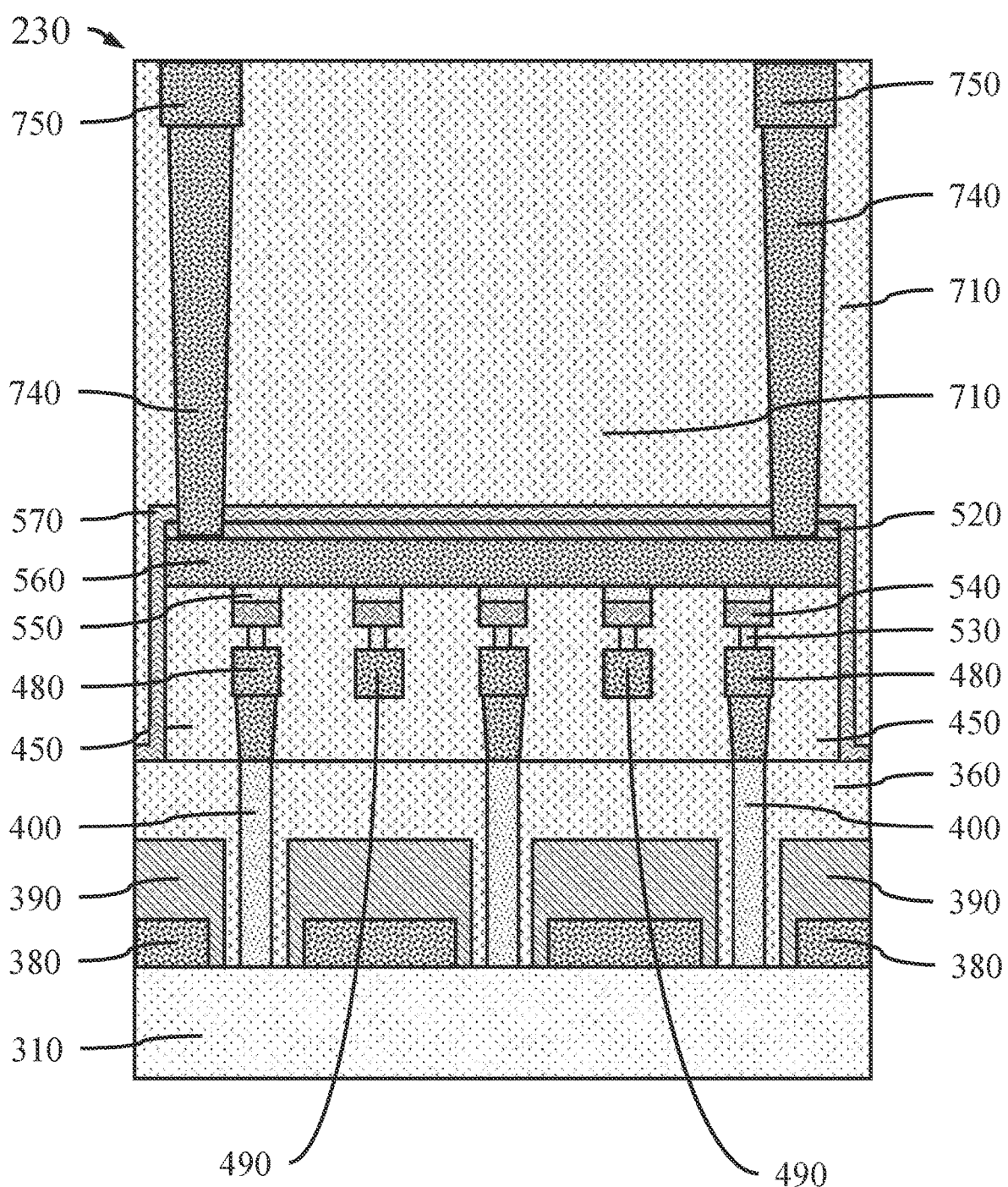
FIG. 24 is a cross-sectional side view showing a second interlayer dielectric (ILD) layer with a metallization layer formed on the capping layer over the region of non-volatile memory devices, in accordance with an embodiment of the present invention.

FIG. 24 is a cross-sectional side view showing a second interlayer dielectric (ILD) layer with a metallization layer formed on the capping layer over the region of non-volatile memory devices, in accordance with an embodiment of the present invention.

In one or more embodiments, a portion 710 of the second interlayer dielectric (ILD) layer 680 with a metallization layer, including via(s) 740 and metal lines 750, can be formed through the protective spacer layer 570 over the region of non-volatile memory 230.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" between two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A high bandwidth memory, comprising:
a region of dynamic random access memory devices;
a region of non-volatile memory devices laterally adjacent to the region of dynamic random access memory devices and above a substrate;
a region of logic devices laterally adjacent to both the region of dynamic random access memory devices and the region of non-volatile memory devices;
a dielectric fill between the logic devices, between the non-volatile memory devices, and between the dynamic random access memory devices, having a top surface at a first level;
an interlayer dielectric on the dielectric fill in the region of logic devices and the region of non-volatile memory devices, having a top surface at a second level and having a trench between the region of non-volatile memory devices and the region of logic devices; and
a protective spacer layer, extending over the interlayer dielectric in the region of non-volatile memory devices, the region of logic devices, and the region of dynamic random access memory devices, and being in direct contact with a vertical sidewall of the trench, electrically insulating the region of non-volatile memory devices and the region of logic devices from the region of dynamic random access memory devices, the protective spacer layer having a top surface in the region of dynamic random access memory devices that is consistently lower than the second level.

2. The high bandwidth memory of claim 1, further comprising a protective spacer layer separating the region of logic devices from the region of non-volatile memory devices.

3. The high bandwidth memory of claim 1, wherein the region of non-volatile memory devices includes a memory material layer between a top memory electrode and a bottom memory electrode.

4. The high bandwidth memory of claim 1, wherein the protective spacer layer is a dielectric material selected from the group consisting of silicon oxycarbide (SiOC), silicon carbide (SiC), silicon nitride (SiN), aluminum nitride (AlNx), and aluminum oxide (AlOx).

5. The high bandwidth memory of claim 1, further comprising a bottom capacitor electrode layer on a Storage Node Contact in the region of dynamic random access memory devices.

6. The high bandwidth memory of claim 5, further comprising a capacitor dielectric layer on the bottom capacitor electrode layer, and a top capacitor electrode layer on the capacitor dielectric layer in the region of dynamic random access memory devices.

7. The high bandwidth memory of claim 6, further comprising a supporting mesh, wherein the bottom capacitor electrode layer is in contact with the supporting mesh.

8. The high bandwidth memory of claim 7, wherein the supporting mesh is selected from the group of a dielectric oxide materials consisting of silicon oxide (SiO), silicon oxycarbide (SiOC), and aluminum oxide (AlOx).

9. A high bandwidth memory, comprising:
a region of dynamic random access memory devices;
a region of non-volatile memory devices laterally adjacent to the region of dynamic random access memory devices;
a region of logic devices laterally adjacent to both the region of dynamic random access memory devices and the region of non-volatile memory devices;
a dielectric fill between the logic devices, between the non-volatile memory devices, and between the dynamic random access memory devices, having a top surface at a first level;
an interlayer dielectric on the dielectric fill in the region of logic devices and the region of non-volatile memory devices, having a top surface at a second level and having a trench between the region of non-volatile memory devices and the region of logic devices; and
a protective spacer layer, extending over the region of non-volatile memory devices, the region of logic devices, and the region of dynamic random access memory devices, and being in direct contact with a vertical sidewall of the trench, that electrically insulates the region of non-volatile memory devices and the region of logic devices from the region of dynamic random access memory devices and the region of logic devices from the region of dynamic random access memory devices, the protective spacer layer having a top surface in the region of dynamic random access memory devices that is consistently lower than the second level.

10. The high bandwidth memory of claim 9, wherein the protective spacer layer is a dielectric material selected from the group consisting of silicon oxycarbide (SiOC), silicon carbide (SiC), silicon nitride (SiN), aluminum nitride (AlNx), and aluminum oxide (AlOx).

11. The high bandwidth memory of claim 9, wherein the region of non-volatile memory devices includes a memory material layer between a top memory electrode and a bottom memory electrode.

12. The high bandwidth memory of claim 11, further comprising a cover layer in the region of logic devices and the region of non-volatile memory devices, wherein the cover layer is on the memory material layer between the top memory electrode and the bottom memory electrode.

13. The high bandwidth memory of claim 9, further comprising a bottom capacitor electrode layer on a Storage Node Contact in the region of dynamic random access memory devices.

14. The high bandwidth memory of claim 13, further comprising a capacitor dielectric layer on the bottom capacitor electrode layer, and a top capacitor electrode layer on the capacitor dielectric layer in the region of dynamic random access memory devices.

\* \* \* \* \*